US008947939B2

(12) United States Patent
Tsai et al.

(10) Patent No.: US 8,947,939 B2
(45) Date of Patent: Feb. 3, 2015

(54) LOW VOLTAGE PROGRAMMING IN NAND FLASH

(75) Inventors: Ping-Hung Tsai, Taoyuan (TW);
Jyun-Siang Huang, Chiayi (TW);
Wen-Jer Tsai, Hualien (TW)

(73) Assignee: Macronix International Co., Ltd., Hsinchu (TW)

( * ) Notice: Subject to any disclaimer, the term of this patent is extended or adjusted under 35 U.S.C. 154(b) by 527 days.

(21) Appl. No.: 12/898,979

(22) Filed: Oct. 6, 2010

(65) Prior Publication Data
US 2012/0081962 A1   Apr. 5, 2012

Related U.S. Application Data

(60) Provisional application No. 61/388,505, filed on Sep. 30, 2010.

(51) Int. Cl.
G11C 16/04 (2006.01)
G11C 16/10 (2006.01)
G11C 16/34 (2006.01)

(52) U.S. Cl.
CPC .......... *G11C 16/0483* (2013.01); *G11C 16/10* (2013.01); *G11C 16/3427* (2013.01)
USPC .................................. 365/185.19

(58) Field of Classification Search
USPC ............. 365/185.05, 185.16, 185.19, 185.21, 365/185.15
See application file for complete search history.

(56) References Cited

U.S. PATENT DOCUMENTS

| | | | |
|---|---|---|---|
| 7,315,474 B2 | 1/2008 | Lue | |
| 7,492,636 B2 | 2/2009 | Wu | |
| 8,582,357 B2* | 11/2013 | Sarin | 365/185.02 |
| 2007/0217264 A1 | 9/2007 | Samachisa | |
| 2008/0049494 A1* | 2/2008 | Aritome | 365/185.02 |
| 2008/0089131 A1 | 4/2008 | Lee | |
| 2009/0027967 A1 | 1/2009 | Lee | |
| 2009/0046506 A1 | 2/2009 | Lue et al. | |
| 2009/0067248 A1 | 3/2009 | Lee | |
| 2009/0086542 A1* | 4/2009 | Lee et al. | 365/185.17 |
| 2009/0109762 A1 | 4/2009 | Huang et al. | |
| 2010/0124120 A1* | 5/2010 | Park et al. | 365/185.19 |
| 2010/0322000 A1* | 12/2010 | Shim et al. | 365/185.03 |

FOREIGN PATENT DOCUMENTS

EP   2048709 A2   4/2009

OTHER PUBLICATIONS

Suh et al., "A 3.3 V 32 Mb NAND Flash Memory with Incremental Step Pulse Programming Scheme," IEEE Journal of Solid-State Circuits, vol. 30, No. 11, Nov. 1995, pp. 1149-1156.

* cited by examiner

*Primary Examiner* — Douglas King
(74) *Attorney, Agent, or Firm* — Yiding Wu; Haynes Beffel & Wolfeld LLP

(57) ABSTRACT

A memory device includes a plurality of memory cells arranged in series in the semiconductor body, such as a NAND string, having a plurality of word lines. A selected memory cell is programmed by hot carrier injection. The program operation is based on metering a flow of carriers between a first semiconductor body region on a first side of the selected cell in the NAND string and a second semiconductor body region on a second side of the selected cell. A program potential higher than a hot carrier injection barrier level is applied to the selected cell, and then the drain to source voltage across the selected cell and the flow of carriers in the selected cell reach a level sufficient to support hot carrier injection, which is controlled by a switch cell adjacent the selected cell.

31 Claims, 18 Drawing Sheets

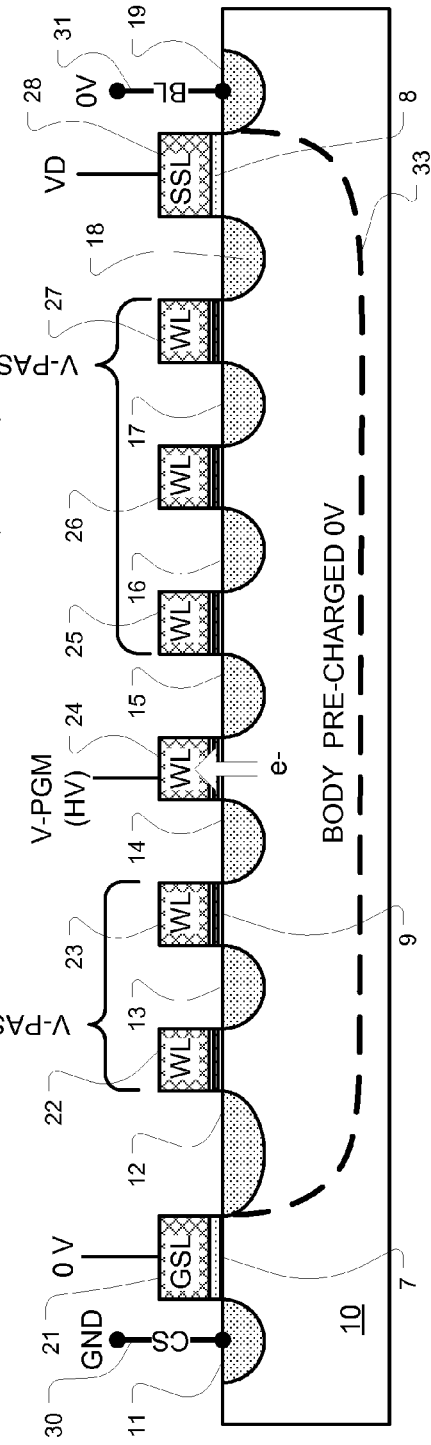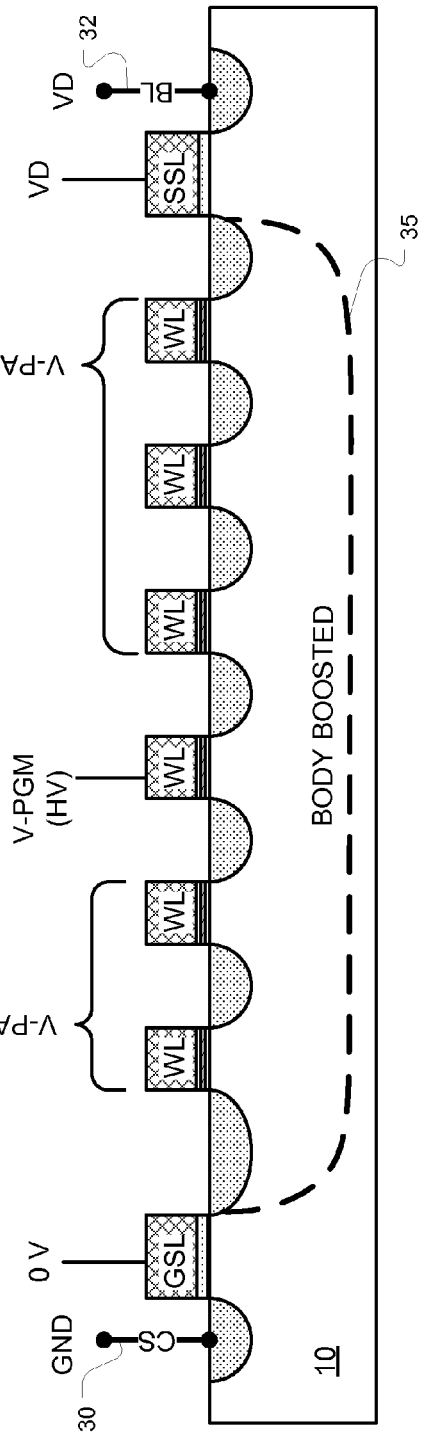

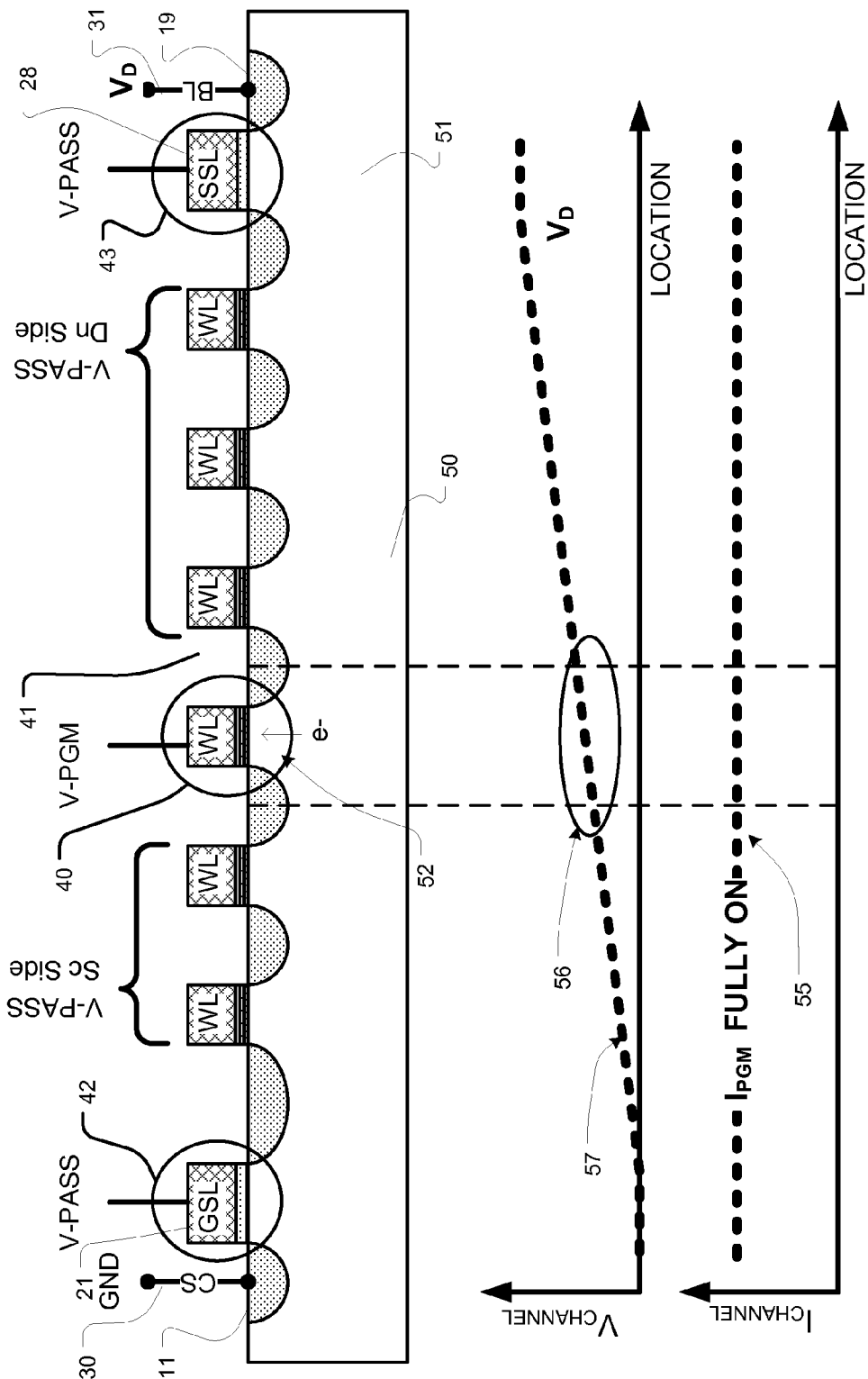
Fig. 2 – PRIOR ART

LOW VOLTAGE PROGRAMMING IN NAND FLASH

REFERENCE TO RELATED APPLICATION

This application claims the benefit under 35 U.S.C. §119 (e) of U.S. Provisional Application No. 61/388,505, filed on 30 Sep. 2010, which is incorporated herein by reference.

The present application is related to co-pending U.S. patent application Ser. No. 12/797,994, entitled HOT CARRIER PROGRAMMING IN NAND FLASH, filed on 10 Jun. 2010, invented by Jyun-Siang HUANG and Wen-Jer TSAI (MXIC1935-1), and is owned by a common assignee.

BACKGROUND OF THE INVENTION

1. Field of the Invention

The present invention relates to flash memory technology, and more particularly to flash memory suitable for low voltage program and erase in a NAND configuration.

2. Description of Related Art

Flash memory is a class of non-volatile integrated circuit memory technology. Traditional flash memory employs floating gate memory cells. As the density increases in memory devices, and the floating gate memory cells get closer and closer together, interference between the charge stored in adjacent floating gates becomes a problem. This is limiting the ability to increase the density of flash memory based on floating gate memory cells. Another type of memory cell used for flash memory can be referred to as a charge trapping memory cell, which uses a dielectric charge trapping layer in place of the floating gate. Charge trapping memory cells use dielectric charge trapping material that does not cause cell-to-cell interference like that encountered with floating gate technology, and is expected to be applied for higher density flash memory.

The typical flash memory cell consists of a field effect transistor FET structure having a source and drain separated by a channel, and a gate separated from the channel by a charge storage structure including a tunnel dielectric layer, the charge storage layer (floating gate or dielectric), and a blocking dielectric layer. According to the early conventional charge trapping memory designs referred to as SONOS devices, the source, drain and channel are formed in a silicon substrate (S), the tunnel dielectric layer is formed of silicon oxide (O), the charge storage layer is formed of silicon nitride (N), the blocking dielectric layer is formed of silicon oxide (O), and the gate comprises polysilicon (S).

Flash memory devices generally are implemented using NAND or NOR architectures, although others are known, including AND architectures. The NAND architecture is popular for its high density and high speed when applied to data storage applications. The NOR architecture is better suited to other applications, such as code storage, where random byte access is important. In a NAND architecture, the programming processes typically rely on Fowler-Nordheim (FN) tunneling, and require high voltages, such as on the order of 20 volts, and require high voltage transistors to handle them. The addition of high voltage transistors on integrated circuits, in combination with transistors used for logic and other data flow, introduces complexity in the manufacturing processes. This increased complexity in turn increases the costs of the devices.

Accordingly, it is desirable to provide a new memory technology suitable for low voltage programming operations, and which is configurable in a NAND architecture.

SUMMARY OF THE INVENTION

A memory device is described configured for low voltage operation that includes a plurality of memory cells arranged in series in the semiconductor body, such as can be applied for a NAND string in a NAND array, having a plurality of word lines coupled to corresponding memory cells. Control circuitry is coupled to the plurality of word lines and to the semiconductor body adapted for programming a selected target memory cell by hot carrier injection in the target cell using controlled word line voltage, referred to as the switch voltage V-SW herein, on an adjacent cell. A source side voltage is applied to one end of the string, which is commonly ground or other voltage specified for source side biasing. The side of the selected memory cell on which the source side voltage is applied for programming is referred to herein as the "effective source side" or "effective source." A drain side voltage is applied to the other end of the string, which can be a supply potential often referred to in the art as VD, or other voltage specified for drain side biasing. The side of the selected memory cell on which the drain side voltage is applied for programming is referred to herein as the "effective drain side" or "effective drain." To control conductance of the switching cell, V-SW sets a bias condition in the body adjacent the target cell that establishes a condition supporting the coincidence of a sufficient heating field (drain to source voltage) and sufficient channel current in the target cell during at least a portion of a program interval in which a program voltage is applied to the target cell, inducing hot carrier injection. Hot carrier injection using this process can be implemented by control circuitry which applies a program voltage to the selected word line (corresponding to the target cell) during the program interval, which applies the switch voltage V-SW to an adjacent word line on the effective source side of the selected word line, and which applies pass voltages to the other word lines, while connecting the semiconductor body between a bit line and a common line to enable program current flow.

The selected word line is biased during the program interval by a program voltage which is sufficient to overcome the channel hot carrier injection barrier level. However, this program voltage can be significantly lower than is required for typical Fowler Nordheim programming. The other word lines corresponding with the plurality of memory cells receive a pass voltage which is lower than the program voltage in order to inhibit disturbance of the other cells. The switching voltage during the program interval is likewise lower than the program voltage to inhibit disturbance of the switching cell.

For a NAND string embodiment, a first switch (ground select switch or bottom bit line select switch) is provided on a first end of the plurality of transistors, and a second switch (string select switch or top bit line select switch) is provided on a second end of the plurality of transistors. In this embodiment, the control circuitry operates to turn on the first switch and the second switch during the program interval to enable current flow in the semiconductor body. Select lines (e.g., string select lines SSL and ground select lines GSL) parallel to the plurality of word lines can be coupled to the first and second switches. When the selected memory cell is adjacent one of the select lines, then the switch voltage V-SW can be applied to the switch, instead of to a memory cell. Alternatively, a dummy word line may be added to the strings, which are operated to receive V-SW for programming the first or last cell in the NAND string.

In a second plurality of memory cells coupled to the same plurality of word lines, such as a parallel NAND string on an unselected bit line, the control circuitry can operate to apply a common voltage (e.g., a source side voltage or a drain side voltage) to both the first and second ends of the plurality of transistors. In this arrangement, the semiconductor body regions on both sides of the selected word line are biased to similar voltage levels to prevent hot carrier injection in unselected strings.

A method for inducing hot carrier injection for programming a selected cell in a NAND string is described as based on metering a flow of carriers and a heating field using V-SW adjacent the selected cell. A program potential higher than a hot carrier injection barrier level is applied to the selected cell, and then the drain to source voltage across the selected cell and the flow of carriers in the selected cell reach a level sufficient to support hot carrier injection.

Other aspects and advantages of the present invention can be seen on review of the drawings, the detailed description and the claims which follow.

BRIEF DESCRIPTION OF THE DRAWINGS

FIGS. 1A and 1B are simplified cross-sectional views of a selected NAND string and an unselected NAND string biased according to prior art FN tunneling programming techniques.

FIG. 2 is a simplified cross-sectional view of a selected NAND string along with graphs of channel current and channel voltage, showing problems associated with prior art attempts to induce hot carrier injection programming in NAND strings.

DETAILED DESCRIPTION

Figure 3:
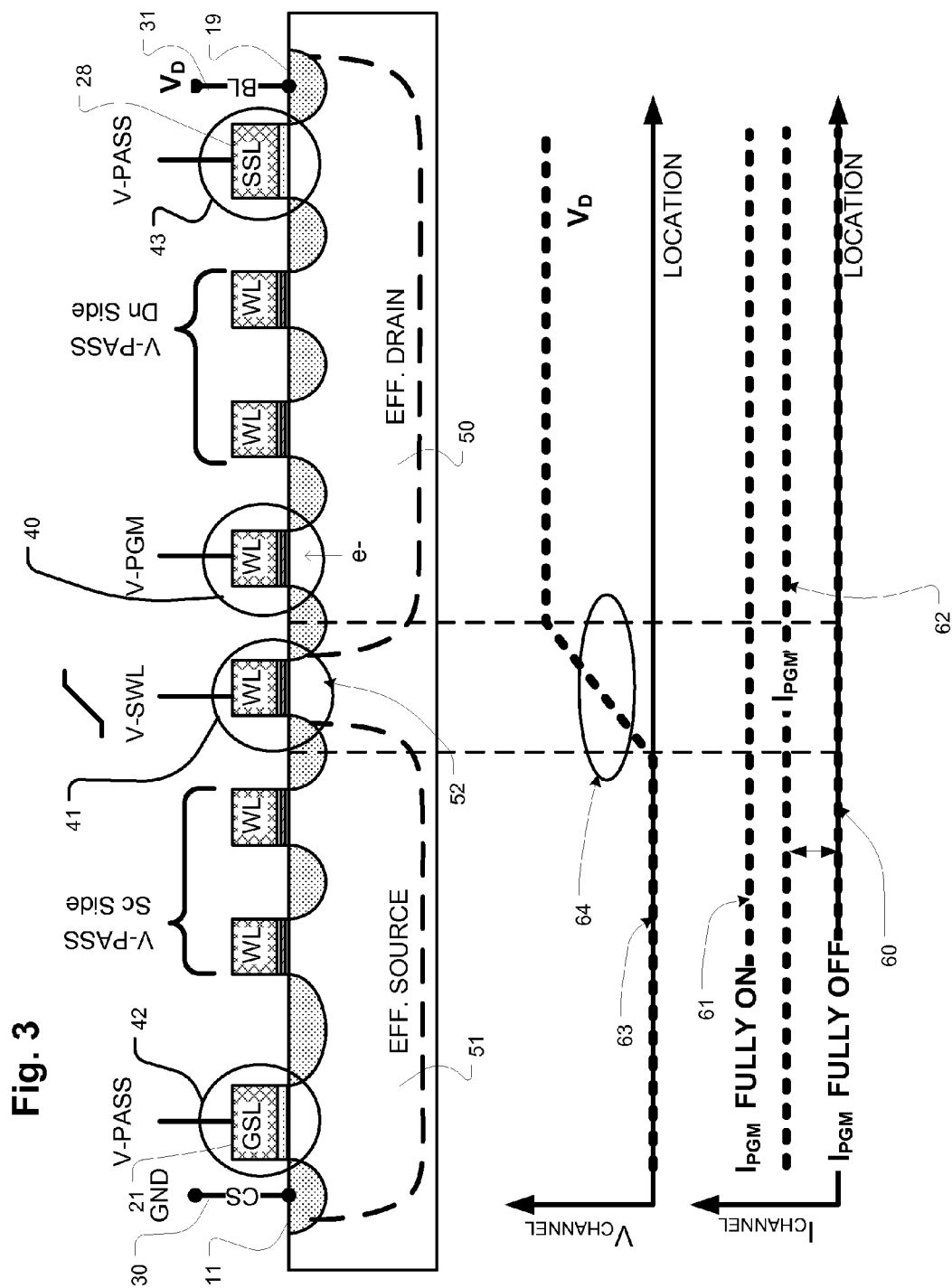
FIG. 3 is a simplified cross-sectional view of a selected NAND string along with graphs of channel current and channel voltage, showing bias conditions for inducing hot carrier injection programming in NAND strings as described herein.

A detailed description of embodiments of the present invention is provided with reference to the FIGS. 1-22.

FIGS. 1A and 1B show in cross-section a plurality of dielectric charge trapping flash memory cells arranged in series to form a NAND string and biased for FN tunneling programming, as is typical in prior art NAND architecture flash memory. FIG. 1A shows the biasing for a NAND string that includes a target cell on a selected bit line, while FIG. 1B shows the biasing for a NAND string on an unselected bit line. One technology for implementation of NAND flash using bandgap engineered SONOS (BE-SONOS) charge trapping technology is described in U.S. Pat. No. 7,315,474 by Lue, which is incorporated by reference as if fully set forth herein. NAND strings can be implemented in a variety of configurations, including finFET technology, shallow trench isolation technology, vertical NAND technology and others. See, for an example vertical NAND structures, European Patent Application No. EP 2 048 709 by Kim et al. entitled "Non-volatile memory device, method of operating same and method of fabricating the same." A similar structure is used for floating gate memory cells, using conductive floating gates.

Referring to FIG. 1A, the memory cells are formed in a semiconductor body 10. For n-channel memory cells, the semiconductor body 10 can be an isolated p-well, within a deeper n-well in a semiconductor chip. Alternatively, the semiconductor body 10 can be isolated by an insulating layer or otherwise. Some embodiments may employ p-channel memory cells in which the doping for the semiconductor body would be n-type.

The plurality of flash memory cells is arranged in a string extending in a bit line direction, orthogonal to word lines. Word lines 22-27 extend across a number of parallel NAND strings. Terminals 12-18 are formed by n-type regions (for n-channel devices) in the semiconductor body 10, and act as the source/drain regions for the memory cells. A first switch formed by a MOS transistor having a gate in a ground select line GSL 21 is connected between the memory cell corresponding with first word line 22 and a contact 11 formed by an n-type region in the semiconductor body 10. The contact 11 is connected to common source CS line 30. A second switch formed by a MOS transistor having a gate in a string select line SSL 28 is connected between the memory cell corresponding to the last word line 27 and a contact 19 formed by an n-type region in the semiconductor body 10. The contact 19 is connected to a bit line BL 31. The first and second switches in the illustrated embodiment are MOS transistors, having gate dielectrics 7 and 8 formed by, for example, silicon dioxide.

In this illustration, there are six memory cells in the string for simplicity. In typical implementations, a NAND string may comprise 16, 32 or more memory cells arranged in series. The memory cells corresponding to the word lines 22-27 have charge trapping structures 9 between the word lines and channel regions in the semiconductor body 10. The charge trapping structures 9 in the memory cells can be dielectric charge trapping structures, floating gate charge trapping structures, or other flash memory structures suitable for programming using techniques described herein. Also, embodiments of NAND flash structures have been developed which are junction-free, where the terminals 13-17, and optionally terminals 12 and 18, may be omitted from the structure.

FIG. 1A shows the biasing according to a typical prior art technology to induce FN tunneling to program the memory cell corresponding with word line 24 (target cell). According to the biasing illustrated, the GSL is biased to about zero volts while the common source line is grounded, so that the first switch corresponding to the GSL line 21 is off, and the SSL is biased to about VD while the selected bit line is grounded, so that the second switch corresponding to the SSL line 28 is on. In these conditions, the semiconductor body in the region 33 associated with the NAND string is pre-charged to about 0 Volts. The selected word line 24 is biased at a high-voltage programming level V-PGM, which can be on the order of 20 volts in some embodiments. The unselected word lines 22, 23 and 25-27 are biased to a pass voltage V-PASS, which is less than V-PMG by an amount that inhibits programming in unselected memory cells in the string. As a result, electrons tunnel into the charge trapping structure of the selected memory cell.

FIG. 1B shows the biasing according to prior art technology at unselected bit lines for NAND strings which share the word lines 22-27 with the string shown in FIG. 1A. As can be seen, the GSL, the SSL and all of the word lines have the same bias voltages as shown in FIG. 1A. Likewise, the common source line 30 is grounded. However, the unselected bit line 32 is biased to a level about VD. This turns off the second switch, which corresponds with the SSL line, and decouples the semiconductor body in the region 35 from the unselected bit line BL 32. As a result, the semiconductor body in the region 35 is boosted by capacitive coupling from the voltages applied to the word lines 22-27, which prevents formation of electric fields sufficient to disturb the charge trapped in the memory cells in the unselected NAND string. So-called incremental step pulsed programming ISPP operations based on capacitive self-boosting are common in the art.

FIG. 2 shows programming bias for a selected NAND string, for hot carrier programming as has been attempted in the prior art.

In FIG. 2, the common source CS line 30 is grounded, and the selected bit line 31 is also coupled to VD. The GSL line 21 is coupled to a pass voltage turning on the first switch 42, coupling the semiconductor body to the CS line 30. The SSL line 28 is coupled to a pass voltage, turning on the second switch 43, and coupling the semiconductor body to the selected bit line 31, which is coupled to VD, or a bit line program bias. The word line corresponding to the target memory cell 40 receives a program pulse at V-PGM. As a result of this biasing arrangement, a channel current IPGM flows in the semiconductor body for the string, which is fully on as shown by trace 55. Also, the drain to source voltage (see region 56) across the target cell is quite small, as the voltage drop from VD to ground is distributed along the string as shown by trace 57 in the VCHANNEL graph. As a result, the heating field in the target cell that corresponds to its drain to source voltage in the program interval is small, and hot carrier injection is slow and inefficient even though the channel current is relatively high. Thus, hot carrier injection has not been adopted to a significant degree for NAND programming.

FIG. 3 shows programming bias for hot carrier injection as described herein. It is noted that for n-channel embodiments, the hot carriers include electrons. For p-channel embodiments, similar bias techniques can be applied to induce hot hole injection, in which the hot carriers include holes. The program process is described with reference to the n-channel embodiment herein, but is referred to as hot carrier injection in reference to alternative p-channel embodiments.

The word line coupled with cell 41 adjacent the target memory cell 40 on the side of the common source CS line 30 receives a switching voltage V-SW which is arranged to cause conditions for efficient hot carrier injection during a portion of the program interval. Under the biasing condition during a program interval, the region 50 in the semiconductor body 10 is pre-charged to a drain voltage VD in response to the pass voltages V-PASS (drain side) on the word lines between the target word line which receives V-PGM and the second switch 43. The region 51 in the semiconductor body 10 is pre-charged to an effective source voltage VS by coupling of the CS line 30 biased to ground while the voltage V-PASS (source side) is coupled to the word lines between the switching cell 41 and the first switch 42. V-PASS (source side) may be the same voltage as V-PASS (drain side), or may be different as suits a particular implementation or programming condition. Also, the pass voltages V-PASS may vary depending on the location in the string. The voltage level in region 50 and the reference voltage level in the region 51 are isolated by the depleted channel region 52 beneath the switching memory cell 41 as long as V-SW is below the threshold of the cell 41, and no current flows as shown by trace 60 on the ICHANNEL graph. As V-SW reaches a programming range, the current in the semiconductor body increases to a program current level sufficient to efficiently support hot carrier injection, at a level 62 between the fully-on channel current level 61 and the fully-off channel current level 60. Also, the voltage drop across the channel 52 of the switching cell 41, as shown in region 64 of the VCHANNEL trace 63, absorbs most of the drop between the bit line voltage for programming and common source line voltage, creating heating fields in the vicinity of the target memory cell 40, that supports hot carrier injection.

In this example, as in all example NAND strings shown herein, the first and second switches (42, 43) are implemented by field effect transistors in series with the memory cells in the string. In the example shown in FIG. 3, the gate dielectrics for the field effect transistors are drawn as single layer structures, and typically comprise a layer of a silicon oxide or nitrogen doped silicon oxide. In other the implementations, the field effect transistor used for the switches (e.g. 42, 43) in example NAND strings shown herein, can have a multilayer gate dielectric, including a gate dielectric that is implemented in the same manner as the charge storage layers in the memory cells in the string. This approach can simplify the manufacturing process. In such embodiments, the first and second switches can be characterized as being "memory cells." The channel lengths of the field effect transistors used to implement the switches can be longer than the channel length in memory cells if desired. Because of relatively lower operating voltages, compared to Fowler-Nordheim tunneling, disturbance of memory cells in the array during programming of a target cell can be suppressed using techniques described herein. Also, because the word line voltage used for the programming method can be lower than that used in conventional NAND flash using Fowler-Nordheim tunneling-based memory devices, the vertical field across the tunnel oxide is smaller. For this reason, it is not necessary to use high-voltage driving devices, and reliability should be better. In addition, using floating gate devices, memory cells can be designed with a lower gate coupling ratio and improved programs speeds are achieved using such low gate coupling ratio cells. Also, as a result of the use of lower voltage devices, the manufacturing processes can be simpler due to the elimination of very high-voltage support devices.

A method for inducing hot carrier injection in a target cell is based on application of a switching word line voltage to control conductance of a switching cell on the source side of the target cell during operation. The conductance is controlled so that cell current in the switching cell is sufficiently off that it can separate the NAND string into two regions, including an effective source region and an effective drain region. The voltage drops in the effective source region and effective drain region are very small. As a result, the applied bit line voltage occurs mostly across the switching cell. Also, the conductance is sufficiently on that a small but sufficient amount of current can flow through the switching cell and target cell, where the carriers are heated and injected into the charge trapping structure in the target cell.

The voltage on the selected bit line and the common source line should be high enough to induce hot carrier heating fields in target cells. The voltage applied to the ground select line and string select line needs to be high enough to fully pass the bit line and common source line voltages. The voltage applied on the ground select line and string select line can be different. Likewise, the voltage applied on the unselected word lines should be high enough to fully pass the applied voltage on the bit lines and common source line. It is noted that the pass voltages on the effective drain side and the pass voltages on the effective source side can be different. Likewise, they can be varied along the length of the string if desired. For the target word line which corresponds with the cell to be programmed, the program voltage applied should be high enough to cause electron injection. The voltage on the switching word line has to lie within an operative range during the programming making the drain to source voltage and the program current at the target memory cell high enough for hot carrier injection.

Figure 4:
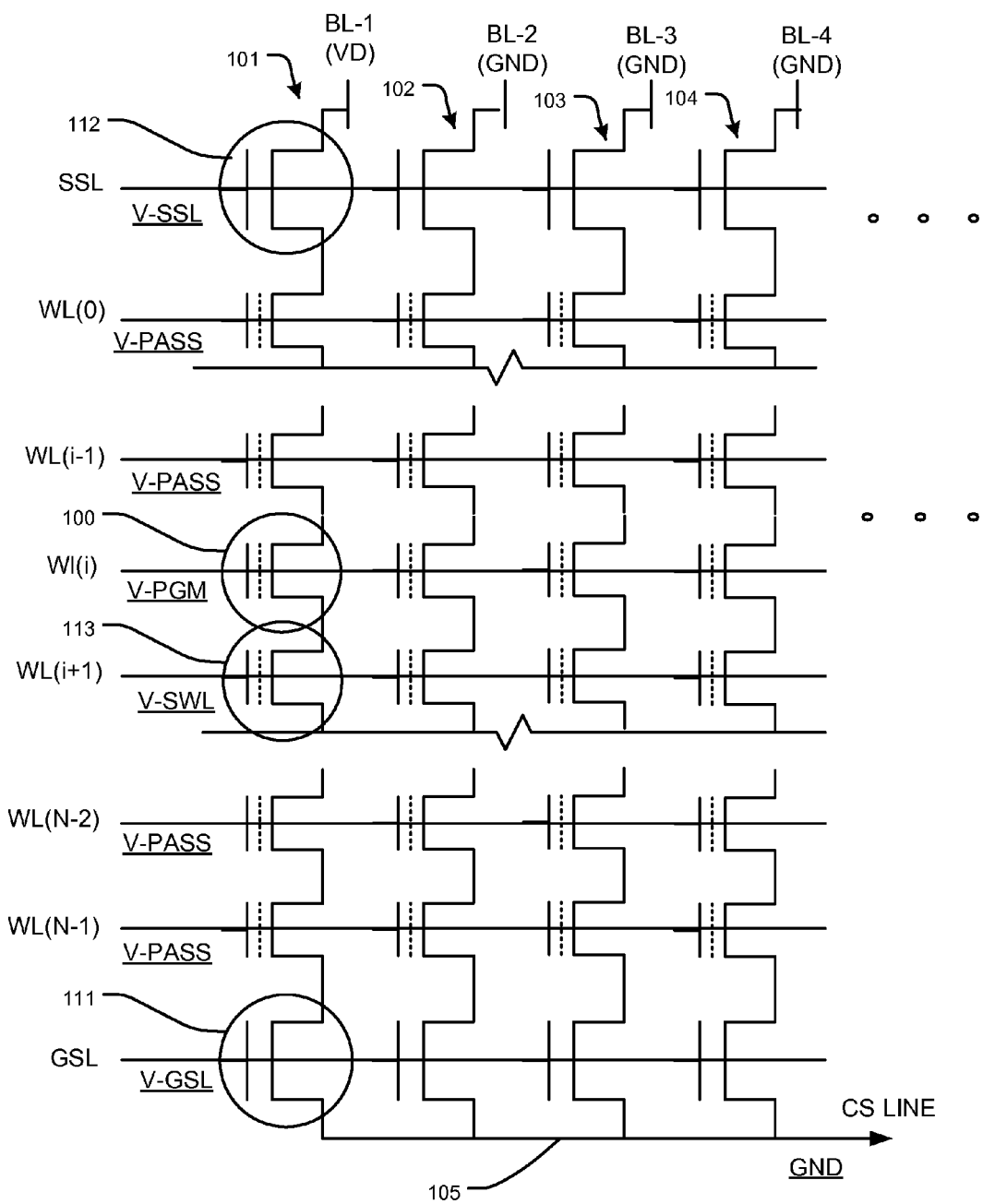
FIG. 4 is a schematic diagram of a common source type NAND-type memory array employing a program bias operation as described herein.

FIG. 4 is a circuit diagram showing layout of four NAND strings 101, 102, 103, 104 coupled to respective bit lines BL-1 to BL-4 and to a common source CS line 105 by string select transistors (e.g. 112) and ground select transistors (e.g. 111), respectively. For the purpose of illustration, the bias voltages are shown for programming a target memory cell 100 on corresponding word line WL(i) in the NAND string 101. The first switch transistor 111 is biased by a ground select line pass voltage such as V-GSL (e.g. a voltage equal to VD) on the GSL line to pre-charge the effective source side of the NAND string via the CS line 105 to ground. The second switch transistor 112 is biased by a string select line pass voltage V-SSL, such as higher than the bit line voltage VD, on the SSL line to pre-charge the effective drain side of the NAND string to the bit line voltage on selected bit line BL-1. A switching memory cell 113 on a corresponding word line WL(i+1) is adjacent the target memory cell 100. Thus, the word line WL(i+1) receives V-SW during the program interval. On the unselected bit lines, the bit line voltage is set to ground, or a level close to that of the CS line, so that both the effective source and effective drain sides are precharged to the same or close to the same voltage, so hot carrier injection is possible. Note that when a target memory cell is on the first word line WL(0), the string select line SSL can be used to apply a switching voltage V-SW, which may be optimized for operation using the switch 111 rather than a memory cell.

Figure 5:
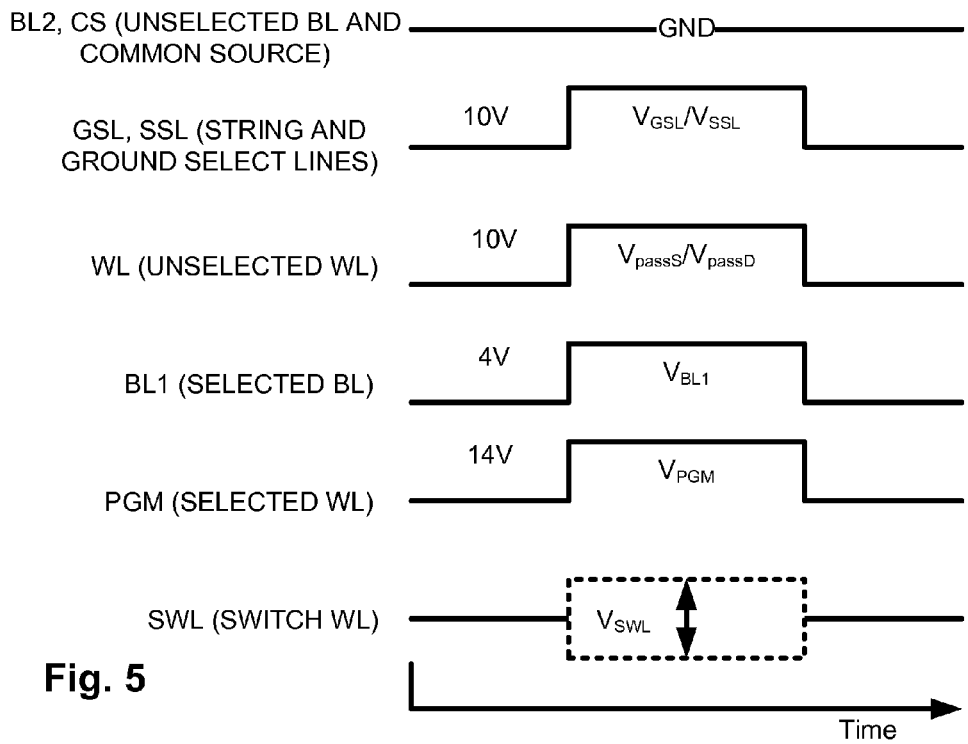
FIG. 5 is a simplified timing diagram for word line and bit line voltages for a hot carrier program operation as described herein.

FIG. 5 is a timing diagram for one example of the bias voltages in connection with the operation described with reference to FIG. 4. Unselected bit lines (e.g. BL-2) and the common source CS line are biased at ground throughout the interval. The ground select word line GSL and string select word line SSL are coupled to about 10 V, throughout the interval. Also, unselected word lines on both the effective source and effective drain sides are coupled to a pass voltage of 10 V in this example. The selected bit line BL-1 is coupled to a drain voltage level high enough to support hot carrier injection, such as 4 V in the program interval. The selected word line receives a program pulse of about 14 V in this example for a program interval. V-SW is set dynamically to a level that depends on the cell threshold of the switching cell adjacent the target cell. For a low threshold switching cell, V-SW may be −4V, for example. Alternatively, V-SW can be set to sweep across an operative range for the distribution of cell thresholds in the memory array, as described in more detail below.

Figure 6:
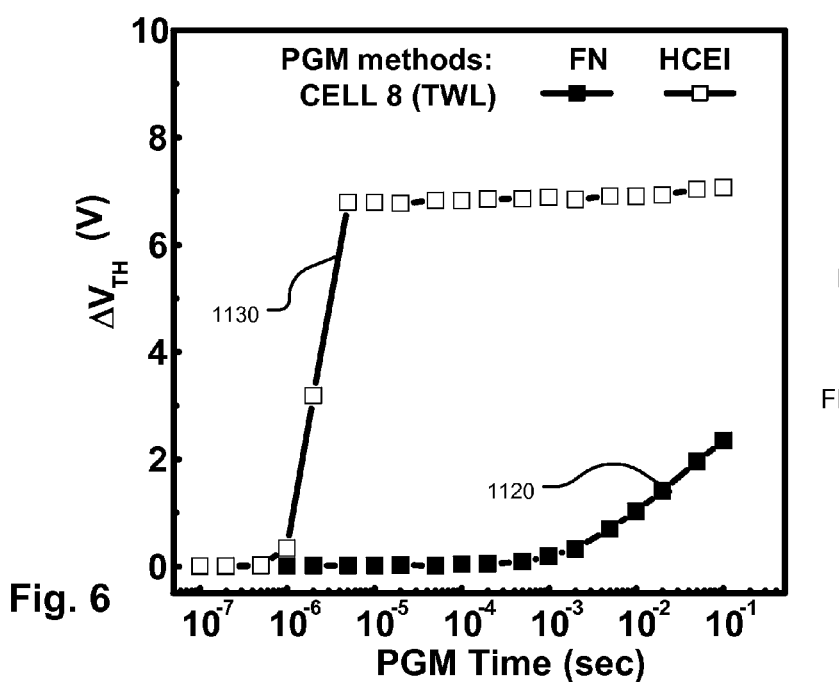
FIG. 6 is a graph of program time versus change in threshold voltage for a hot carrier program operation as described herein, and a prior art FN tunneling program operation with similar program voltage levels.

FIG. 6 shows change in threshold voltage versus program time for hot carrier injection using the biasing arrangement of FIG. 5, and for FN tunneling using a program potential equal to the program potential used for hot carrier injection. As can be seen, trace 1130 shows programming time on the order of 3 microseconds for hot carrier injection when the switching cell is in the low threshold state. Trace 1120 shows that the programming time for FN tunneling at a similar program potential could be more than 100 milliseconds. Thus, fast programming is achieved with relatively low voltages utilizing biasing arrangements described herein.

For reference, representative bias levels for erase operations are shown in the following table.

|  | Erase |
| --- | --- |
| Unselected WL | −8 V |
| Selected WL | −8 V |
| Switch WL | −8 V |
| Unselected BL | Floating |
| Selected BL | Floating |
| PW | 12 V |
| SSL | Floating/VD |
| GSL | Floating/VD |
| Common Source | Floating |

Figure 7:
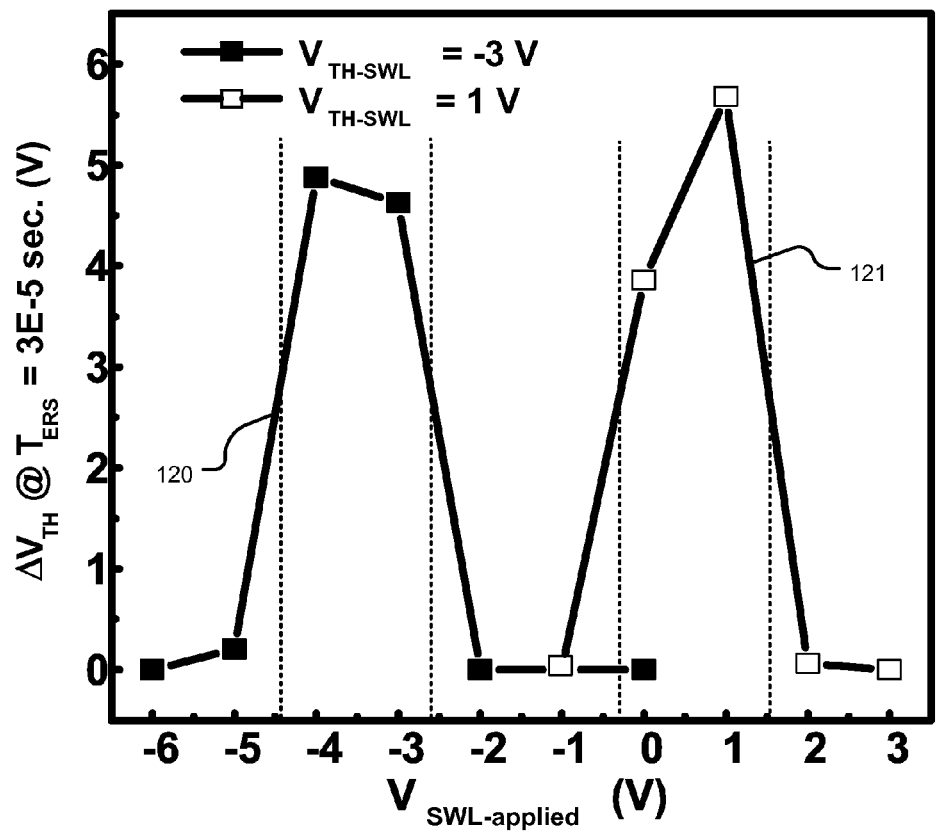
FIG. 7 is a graph showing threshold change versus V-SW for a cell corresponding to the word line receiving V-SW, having a threshold at −3 Volts and at +1 Volts, illustrating ranges of operation for V-SW.

FIG. 7 is a graph of the applied V-SW versus changing threshold voltage for a switching cell that has a −3 V threshold on trace 120, and for a switching cell that has a positive 1 V threshold on trace 121. Trace 120 shows that the preferred range of switching voltage for a low threshold cell in this example fell between about −4.6 and −2.7. The optimal range for the cell having a positive 1 V threshold fell within the range of about −0.2 V to about +1.6 V. These results illustrate that the optimal range for the switching voltage varies with the threshold value for the switching cell. This occurs because the conductance of the switching cell is determined by the difference between the switching voltage applied to its word line and its threshold. Since the switching cell is a memory cell in most instances, the threshold will vary depending on the data values stored.

Figure 8:
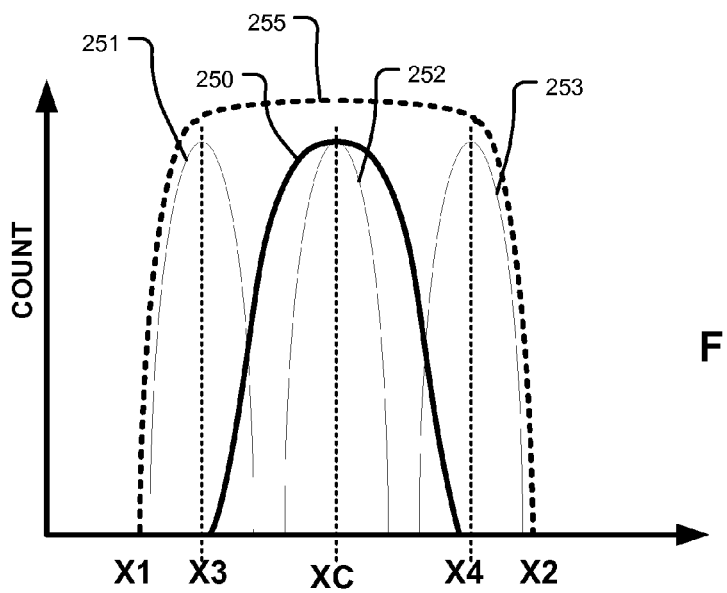
FIG. 8 is a graph showing a cell threshold distribution for a memory array, with V-SW distributions at the center and edges of the cell threshold distributions, illustrating an approach to determining a range for V-SW for operation as described herein.

FIG. 8 is a graph showing a heuristic threshold voltage distribution 250 for a large NAND array including many NAND strings. Within this distribution 250, a given cell may have a threshold at value X3, another may have threshold at value X4 and another may have a threshold in the center at value XC. For each of the three representative threshold values, there will be a range of optimal switching voltages. Thus, for a cell having a threshold at value X3, a range 251 of optimal switching voltages may occur. For a cell having a threshold at value XC, a range 252 of optimal switching voltages may occur. For a cell having a threshold value X4, a range 253 of optimal switching voltages may occur. As a result, for an entire array, the range of optimal switching voltages can be represented by the distribution 255, extending from a value X1 to a value X2. Therefore, for a given program operation in a large array, a switching voltage may need to fall within the range from X1 to X2. In a representative system, an outside low value X1 for the range of optimal switching voltage for a fast programming speed can occur about 0 to 1 V less than X3, and an outside high-value X2 for the range of optimal switching voltage for a fast programming speed can occur about 0 to 1 V greater than X4. In other systems, the optimal range might be extended about 2 or 3 Volts outside the threshold voltage range.

Figure 9:
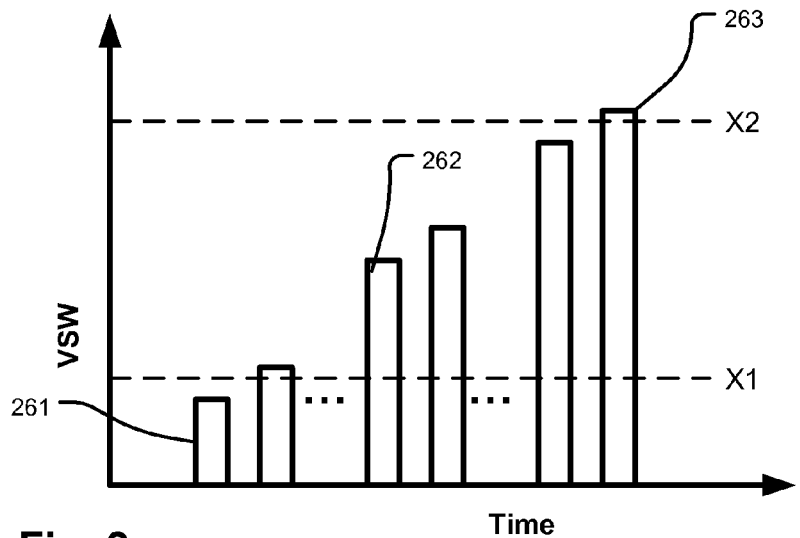
FIG. 9 is a timing diagram for a stepped pulse, verify and retry algorithm usable to set V-SW during a program operation.

In implementing a NAND memory device utilizing this technique, an algorithm for applying the optimal switching voltage to the switching cell adjacent the target memory cell is implemented which accounts for the variation in threshold voltages. FIG. 9 illustrates one algorithm for applying the switching voltage across the necessary range. The algorithm involves a stepped switching voltage level during a sequence of program pulses, with a verify and retry step between each program pulse. As illustrated in FIG. 9, a first pulse 261 should have a magnitude slightly lower than X1. Each pulse in the sequence (e.g pulse 262) should step up by a small voltage, such as for example 0.2 volts. A last pulse 263 in the sequence should have a magnitude slightly higher than X2. In an alternative, a stepping down sequence can be applied, beginning with a pulse slightly higher than X2 and ending with a pulse slightly lower than X1. An advantage of the stepped pulse approach is that it enables the use of square pulses which can be generated using simple circuitry. A disadvantage is that the program time for a given target cell may vary depending on the threshold of its adjacent switching cell.

Figure 10:
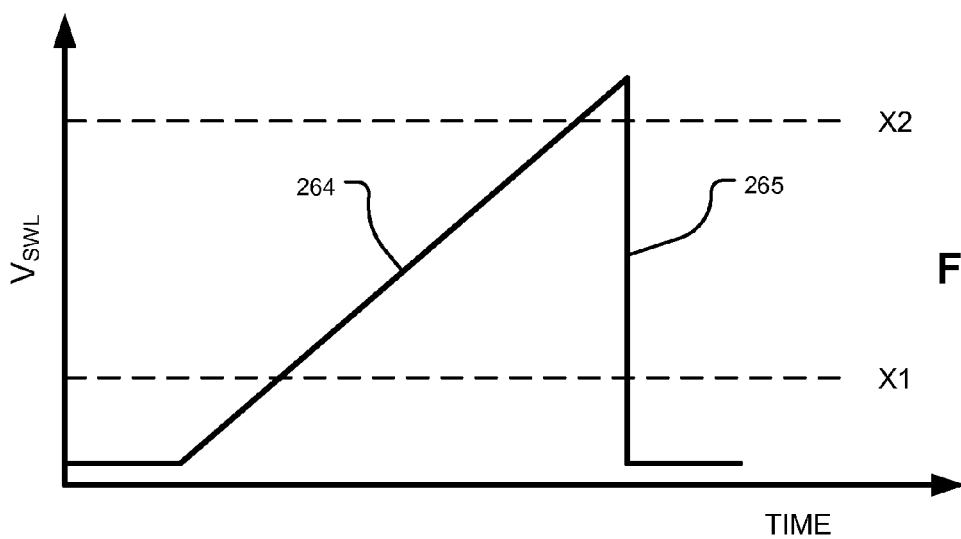
FIG. 10 is a timing diagram for an increasing ramp triangle-shaped pulse for V-SW usable in a program operation.

FIG. 10 illustrates an alternative, using a ramping switching voltage. During a program interval, the switching voltage can increase from a base level below X1 on a positive ramp 264 to the peak above X2, and then fall below X1 on line 265. In this way, the optimal bias condition for the switching cell is traversed during a least a part of the program interval. For the ramped switching voltage, the slope of the ramp 264 should be small enough to ensure that all of the cells have sufficient reaction time for the hot carrier injection programming of the target cell. This slope can vary depending on the memory cell implementation. It is expected that a slope from about 0.1 V per microsecond to about 10 V per microsecond could be utilized for various NAND configurations.

Figure 11:
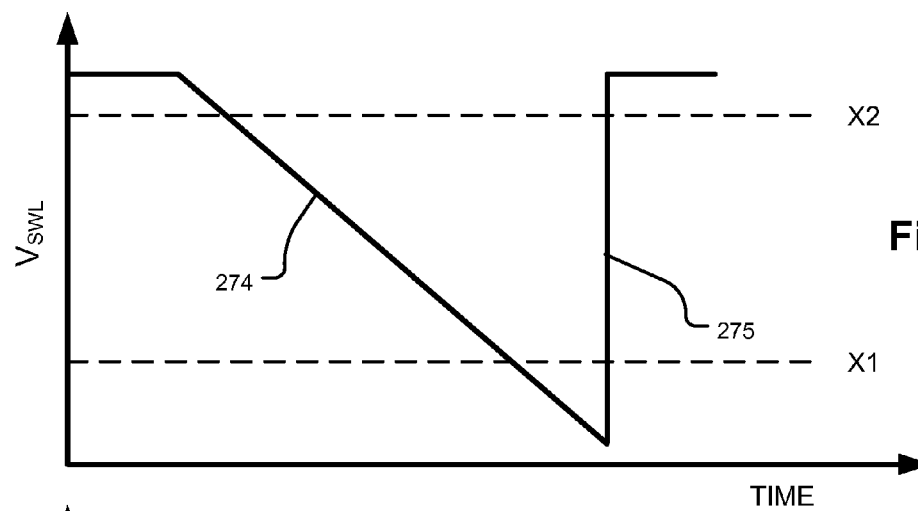
FIG. 11 is a timing diagram for a decreasing triangle-shaped pulse for V-SW usable in a program operation.

FIG. 11 illustrates a downward ramped switching voltage. In the switching pulse shown in FIG. 11, the switching voltage starts at a level above X2, and ramps down 274 to a minimum below X1, after which it returns to the high level on line 275.

Figure 12:
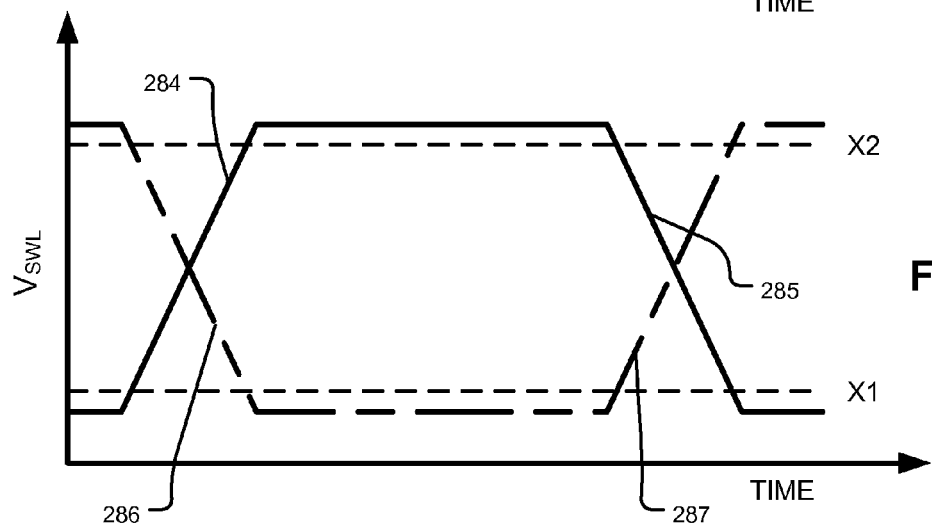
FIG. 12 is a timing diagram for a leading and trailing ramped pulse algorithm usable to set V-SW during a program operation.

FIG. 12 shows a switching voltage pulse 285 with a sloped leading and sloped trailing edge, where the pulse starts a level below X1 and increases to a level above X2, and thereafter decreases from the level above X2 to a level below X1. This pulsed switching voltage with sloped leading and trailing edges (284, 285) can achieve fast program speeds with a slope on the leading edge and on the trailing edge from about 0.1 V per microsecond to about 10 V per microsecond. Also shown is an inverted switching pulse 286 where the pulse starts a level above X2 and decreases on leading edge 286 to a level below X1, and thereafter increases on trailing edge 287 from the level below X1 to a level above X2.

Other switching voltage algorithms can be applied as well. For example, one might first sense the threshold of the switching cell, and then apply a more narrow switching voltage range to match that threshold.

Figure 13:
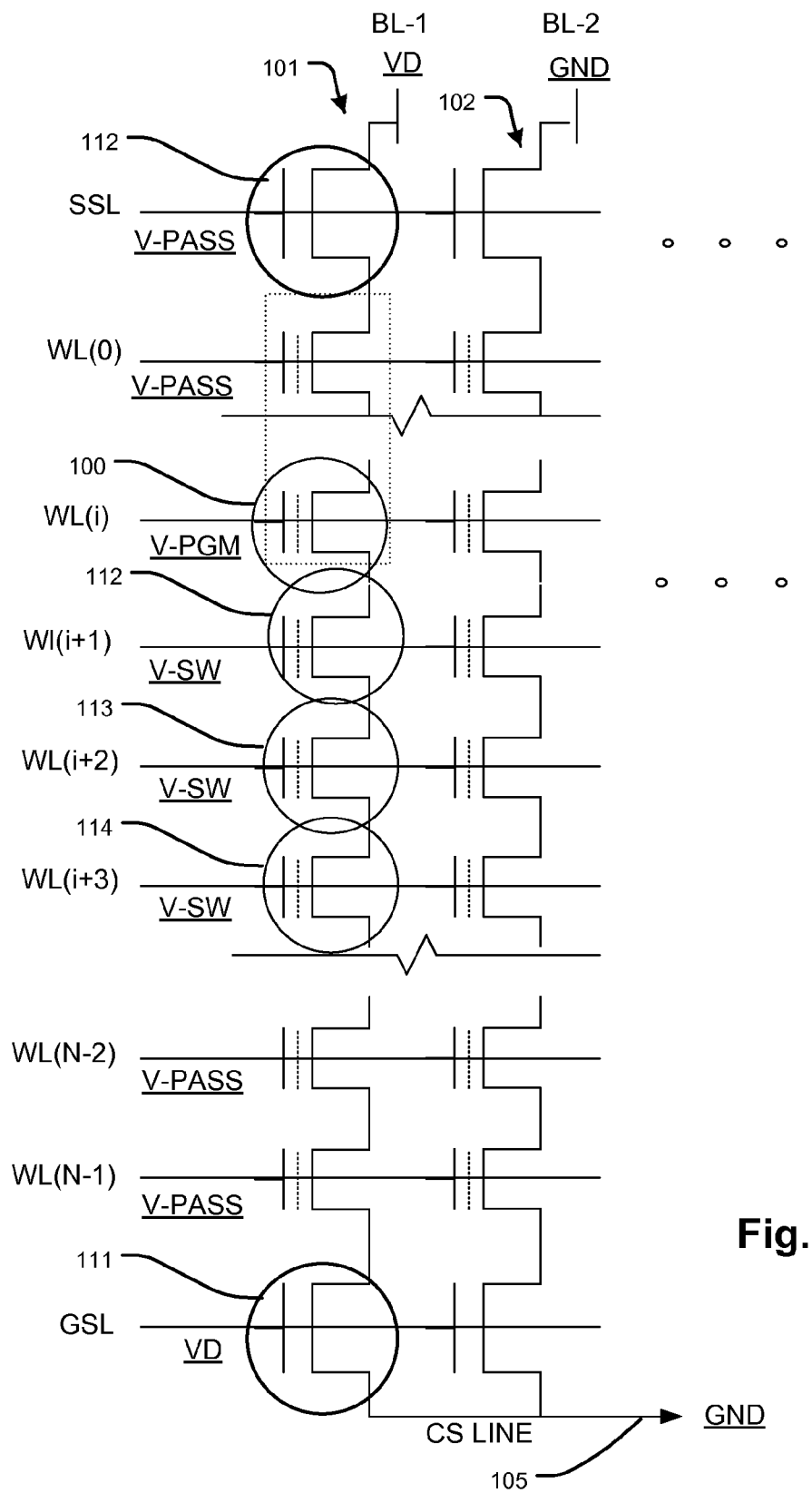
FIG. 13 is a schematic diagram of a common source type NAND-type memory array employing a program bias operation as described herein according to an alternative configuration using multiple switch word lines.

FIG. 13 shows the bias conditions in which multiple switching cells 112, 113, 114, adjacent to target memory cell 100 on the common source CS side of the string, are utilized. Using multiple switching cells, such as two, or in the illustrated example three, including cells 112, 113, 114, the cell with the higher threshold value can dominate the performance of the programming operation for a given switching voltage. This can tend to tighten the distribution of optimal switching voltages. Thus, FIG. 13 is a circuit diagram showing layout of two NAND strings 101, 102 which are coupled to respective bit lines BL-1 to BL-2 and to a common source CS line 105 by string select transistors and ground select transistors, respectively. The bias voltages are shown for programming a target memory cell 100 on a corresponding word line WL(i) in the NAND string 101. The first switch transistor 111 is biased by VD or other pass voltage on the GSL line to couple the NAND string to the grounded CS line 105. The second switch transistor 112 is biased by V-PASS on the SSL line and VD on the selected bit line BL-1 to couple the top of the NAND string to the selected bit line BL-1. Three switching memory cells 112, 113, 114 on corresponding word lines WL(i+1), WL(i+2) and WL(i+3) are adjacent the target memory cell 100. Thus, the word lines WL(i+1), WL(i+2) and WL(i+3) receive V-SW supporting the hot carrier injection program interval. On the unselected bit lines, which are coupled to 0 V, the effective drain and effective source regions are biased to ground via unselected bit lines BL-2 and the CS line 105.

Figure 14:
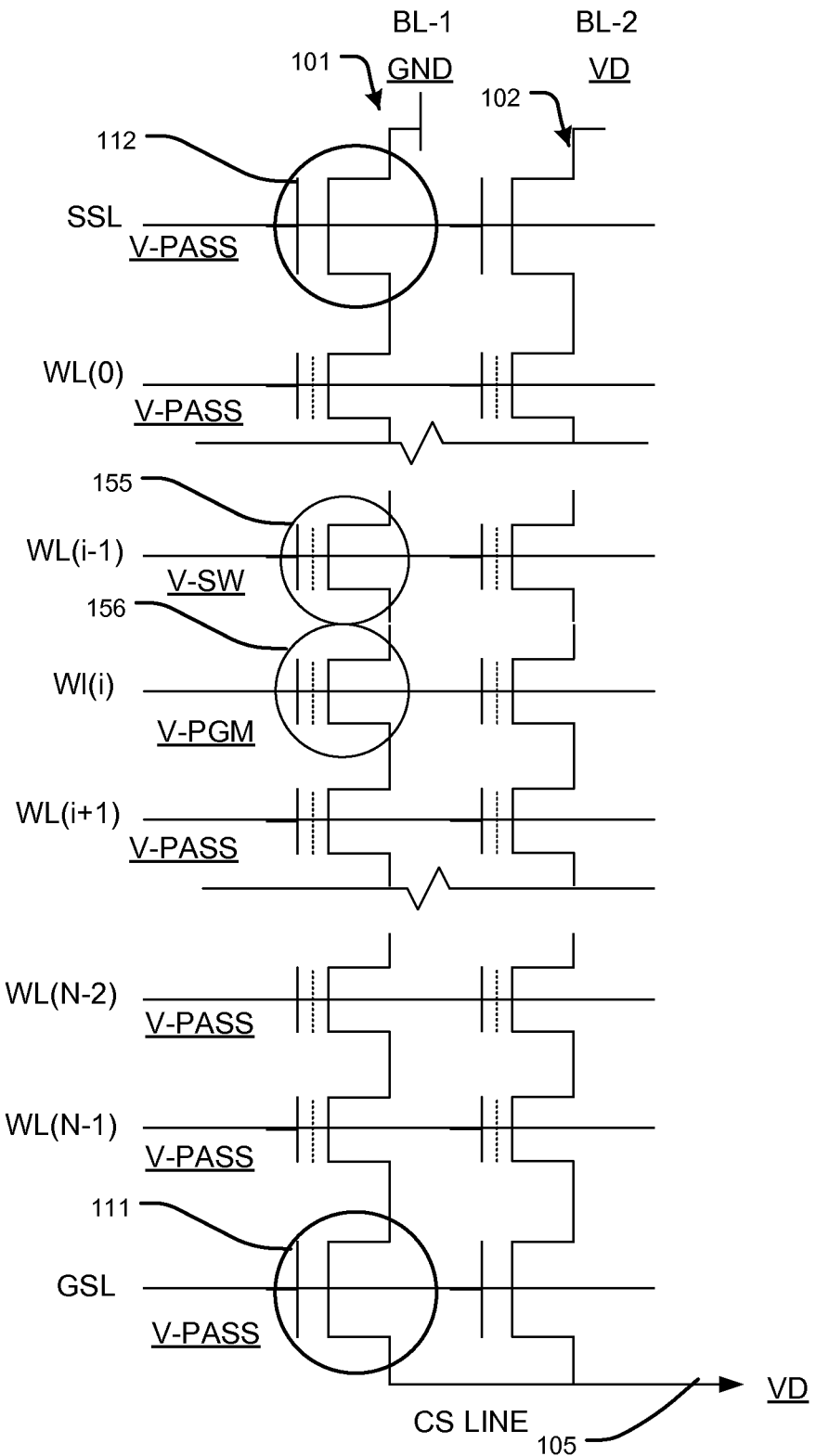
FIG. 14 is a schematic diagram of a common source type NAND-type memory array employing a program bias operation as described herein according to an alternative configuration using a grounded bit line, and VD on the common source line, with unselected bit lines having VD bias.

Alternative biasing arrangements and array configurations are also possible. The representative implementation shown in FIG. 4 involves biasing so that the current flow in the NAND string is from the common source line (low voltage) to the selected bit line (higher voltage). FIG. 14 illustrates an alternative with current flow in the opposite direction. In the example shown in FIG. 14, the selected bit line is biased to a ground potential, and the common source line is biased to a drain potential VD. The target memory cell corresponding with word line WL(i) receives the program potential. The switching voltage is applied to the word line WL(i−1) on the bit line side of the NAND string. The bias voltage from the selected bit line at ground potential is used to establish an effective source region in the NAND string between the string select switch 112 and the target memory cell 156. The switching memory cell 155 receives the switching voltage which meters the conductance of the switching cell to create the hot carrier injection conditions described above. The unselected bit lines receive a supply potential such as VD, which is the same or close to the same as that applied to the common source line. Thus, the effective source and effective drain regions in the unselected NAND strings have similar voltages, inhibiting hot carrier injection.

Figure 15:
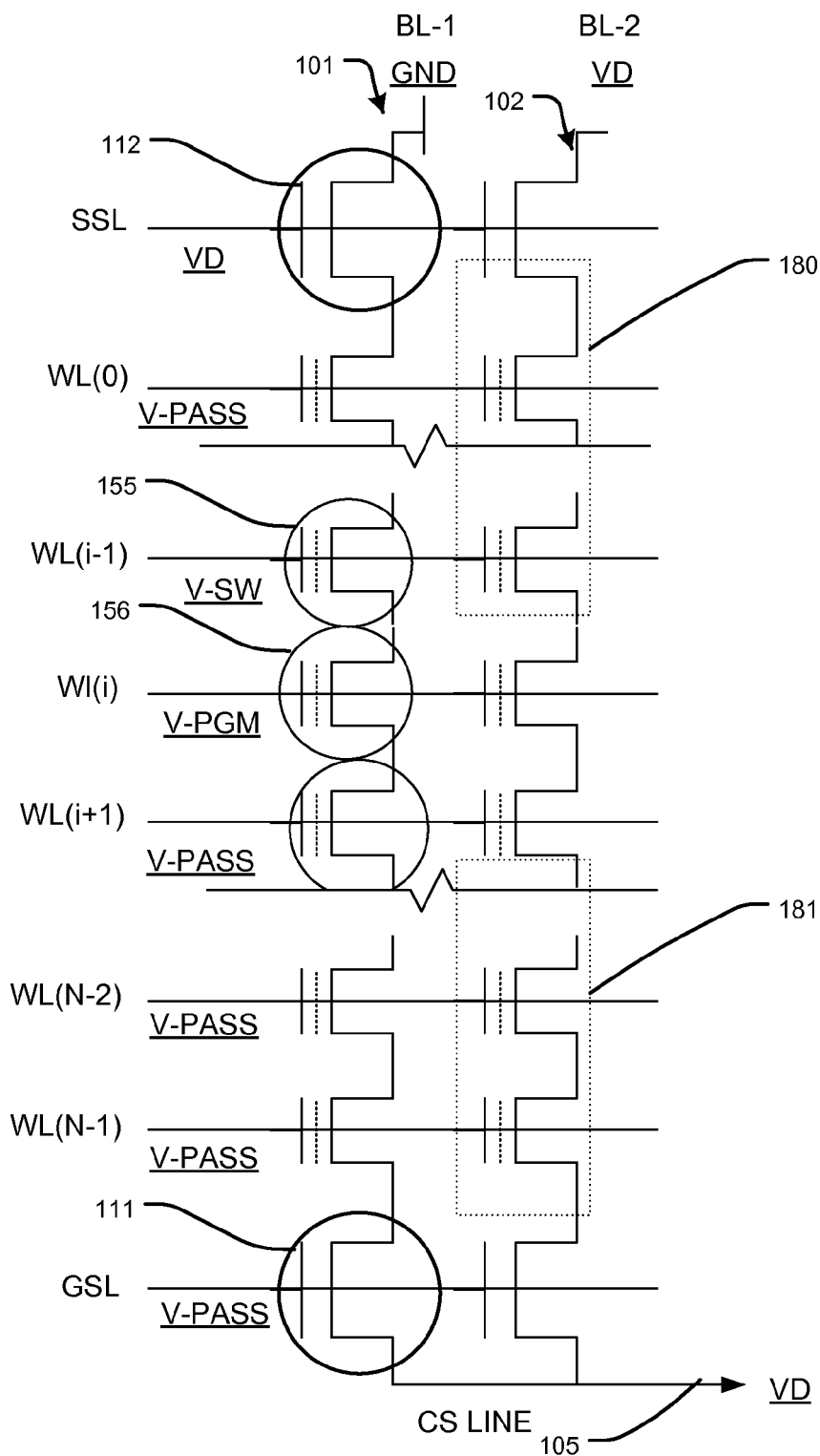
FIG. 15 is a schematic diagram of a common source type NAND-type memory array employing a program bias operation as described herein according to an alternative configuration using a grounded bit line, and VD on the common source line, with unselected bit lines having VD bias on the CS side and boosted potential on the BL side.

FIG. 15 illustrates another alternative biasing arrangement utilizing a boosted effective source region in the unselected NAND strings to inhibit program disturbance. In this arrangement, the biasing voltages are like those shown in FIG. 14, except that the biasing voltage on the string select line is set at VD, which is equal to the bias VD on bit line BL-2. As a result, the effective source region 180 in the semiconductor body of string 102 is isolated from the unselected bit line. Also, it is isolated from the common source line as a result of the potential on the word line WL(i−1) receiving the switching voltage, separating the effective drain region 181 from the effective source region 180. The isolated effective source region 180 is boosted by capacitive coupling as result of the voltage pulses at the V-PASS potential during a program interval so that it has a voltage level close to that of the effective drain region 181. Also, current in the string is blocked, inhibiting hot carrier injection.

When the target cell for programming is the first memory cell in the NAND string, next to the ground select line, there is no memory cell adjacent the target memory cell on the effective source side that can be used as the switching cell. Conversely, when the target cell for programming is the last memory cell in the NAND string, next to the string select line, and the string is biased to make the effective source at the top, then again, there is no memory cell adjacent the target memory cell on the effective source side that can be used as the switching cell. In these cases, the string select line or ground select line can be utilized to control the conductance of the semiconductor body in the manner of a memory cell, with suitable applied voltage. In an alternative, dummy word lines can be utilized.

Figure 16:
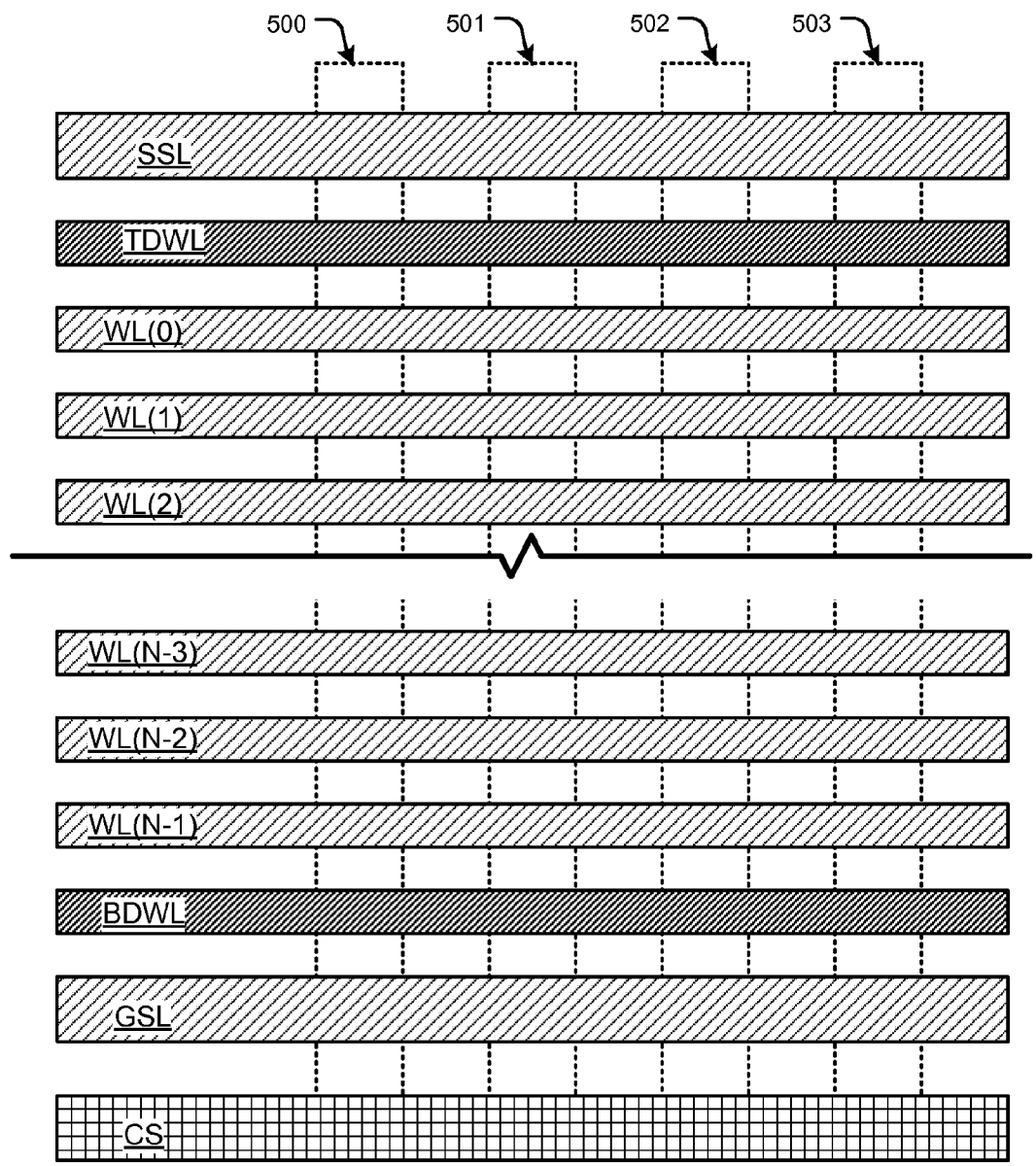
FIG. 16 is a simplified layout view of a NAND array showing a configuration for dummy word lines on both ends of the strings.

FIG. 16 shows a simplified layout view showing the word lines and source-drain strings of a NAND array like that of FIG. 3 with, in addition, a bottom dummy word line BDWL adjacent the GSL line and a top dummy word line TDWL adjacent the SSL line. A dummy word line may be place on only one end, if one way operation of the programming current is being used. As shown, source-drain strings 500-503 extend vertically on the page. Horizontal conductor lines overlie the source-drain strings 500-503. The horizontal conductor lines include the SSL line, top dummy word line TDWL, word lines WL(0) to WL(N−1) and the bottom dummy word line BDWL. Also, the horizontal conductor lines include the GSL line in the common source CS conductor. The dummy word line on the top or bottom of the string can be used for controlling a dummy memory cell, during hot carrier injection programming as described here.

Figure 17:
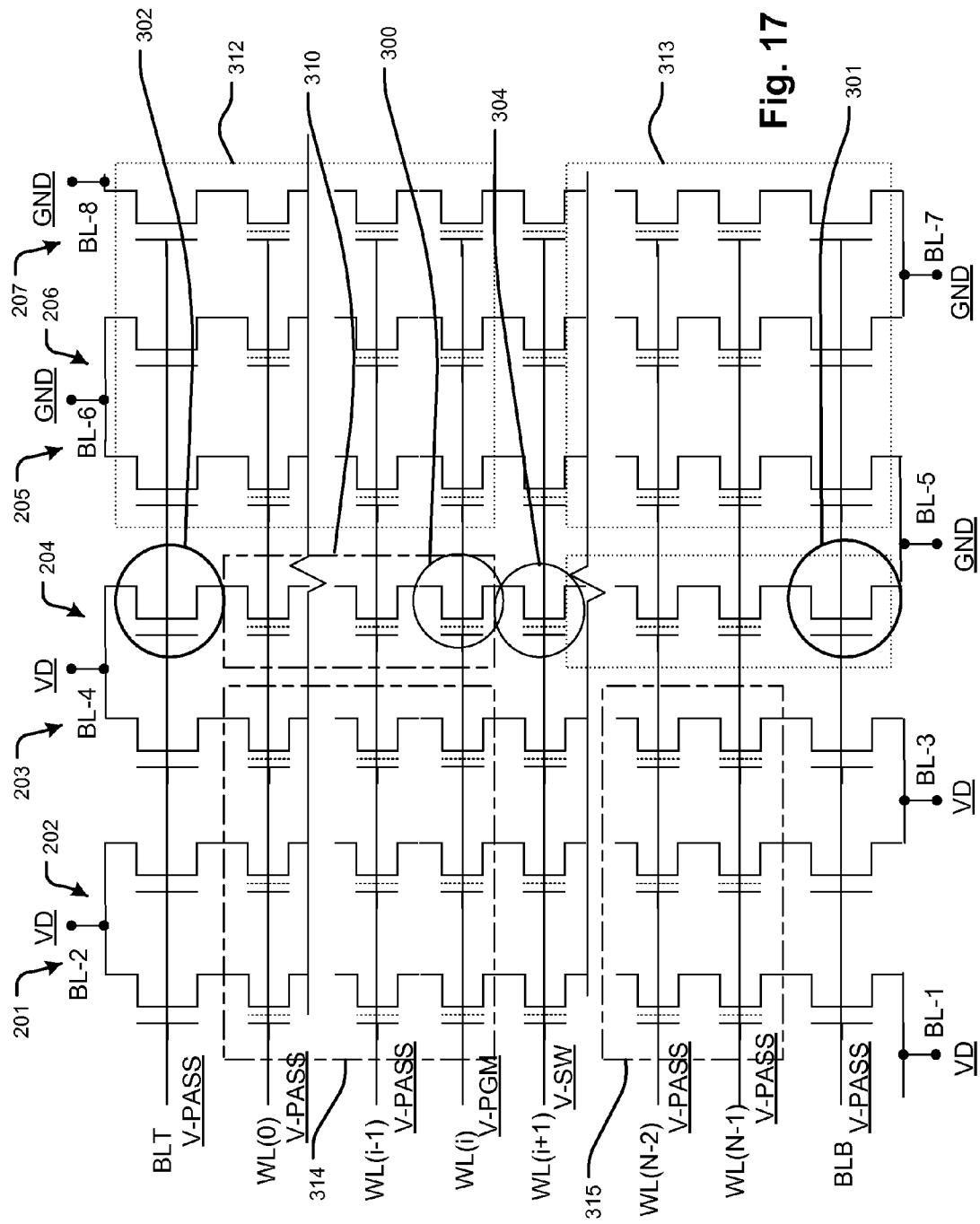
FIG. 17 is a schematic diagram of a virtual ground NAND-type memory array employing a program bias operation as described herein with programming current flow from bottom to top.

FIG. 17 is a circuit diagram showing layout of seven NAND strings 201-207 arranged in a virtual ground NAND architecture. In a virtual ground architecture as described here, the bit lines act as both bit lines coupled to sense amplifiers and reference lines coupled to reference voltage sources, depending on the column being accessed. The NAND strings are coupled to corresponding pairs of bit lines BL-1 to BL-8 by top bit line select transistors BLT and bottom bit line select transistors BLB. For the purpose of illustration, the bias voltages are shown for programming a target memory cell 300 on corresponding word line WL(i) in the NAND string 204. The first switch transistor 301 is biased by VPASS on the BLB line to couple the NAND string 204 to BL-5, which is grounded. The second switch transistor 302 is biased by V-PASS on the BLT line to couple the NAND string 204 to the bit line BL-4, which is biased at VD. All of the bit lines BL-1 to BL-3 to the left of target NAND string 204, are biased at VD. All of the bit lines BL-6 to BL-8 to the right of the target NAND string 204 are biased at ground. A switching memory cell 304 on corresponding word line WL(i+1) is adjacent the target memory cell 300. Thus, the word line WL(i+1) receives the V-SW. The semiconductor body in the region 310 is biased to the effective drain voltage VD, thereby setting up the effective drain region in NAND string 204. On the unselected strings to the right, the effective drain and source regions 312 and 313 are biased to ground potential via the bit lines BL-5 to BL-8 to avoid disturbance of memory cells in those strings. On the unselected strings to the left, the regions 314 and 315 are coupled to a relatively high voltage such as VD on the bit lines BL-1, BL-2, BL-3, to avoid disturbance of memory cells in those strings. Thus, when the switching memory cell 304 receives a switch voltage enabling hot carrier injection, the target memory cell 300 is programmed by hot carrier injection, while the other memory cells in the array are not disturbed.

Figure 18:
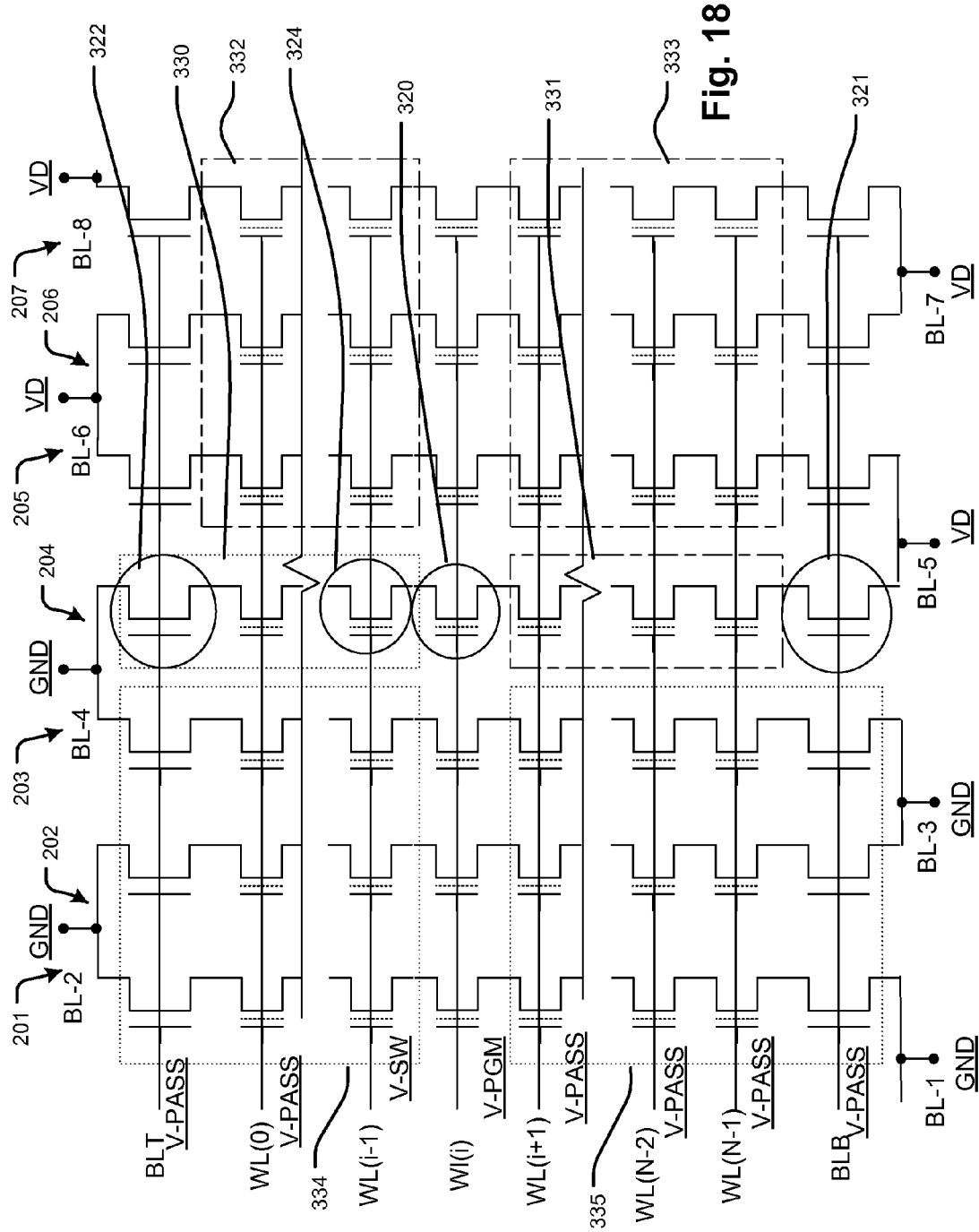
FIG. 18 is a schematic diagram of a virtual ground NAND-type memory array employing a program bias operation as described herein with programming current flow from top to bottom.
Figure 19:
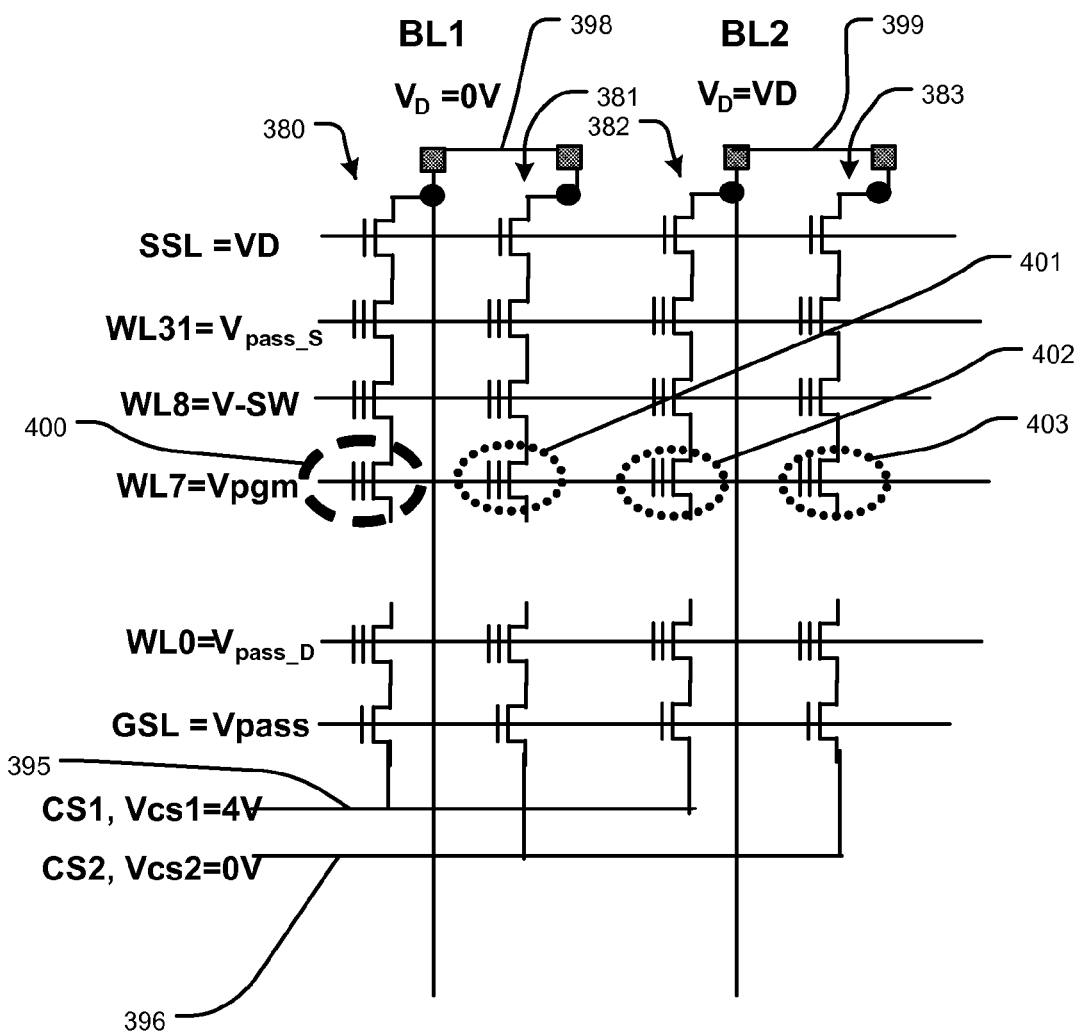
FIG. 19 is a simplified schematic diagram of a multi-plane common source type NAND-type memory array employing a program bias operation as described herein with shared bit lines and common source decoding.

FIG. 18 shows a biasing arrangement for a virtual ground NAND array like that shown in FIG. 19, in which the switching transistor is on the other side. The NAND strings are coupled to corresponding pairs of bit lines BL-1 to BL-8 by top bit line select transistors BLT and bottom bit line select transistors BLB. For the purpose of illustration, the bias voltages are shown for programming a target memory cell 320 on corresponding word line WL(i) in the NAND string 204. The first switch transistor 321 is biased by V-PASS on the BLB line, which couples the NAND string 204 to BL-5, which is biased at VD. The second switch transistor 322 is biased by V-PASS on the BLT line to couple the NAND string to the bit line BL-4 which is grounded. All of the bit lines BL-1 to BL-3 to the left of NAND string 204 are grounded. All of the bit lines BL-6 to BL-8 to the right of NAND string 204 are biased at VD. A switching memory cell 324 on corresponding word line WL(i−1) is adjacent the target memory cell 320. Thus, the word line WL(i−1) receives V-SW. The semiconductor body in the region 331 is biased to the effective drain voltage VD. On the unselected strings to the right, the regions 332 and 333 are coupled to a relatively high voltage to avoid disturbance of memory cells in those strings. On the unselected strings to the left, the regions 334 and 335 are biased to ground potential via the bit lines BL-1 to BL-4 to avoid disturbance of memory cells in those strings. Thus, hot carrier injection happens in the target memory cell 320, while the other memory cells in the array are not disturbed.

Figure 20:
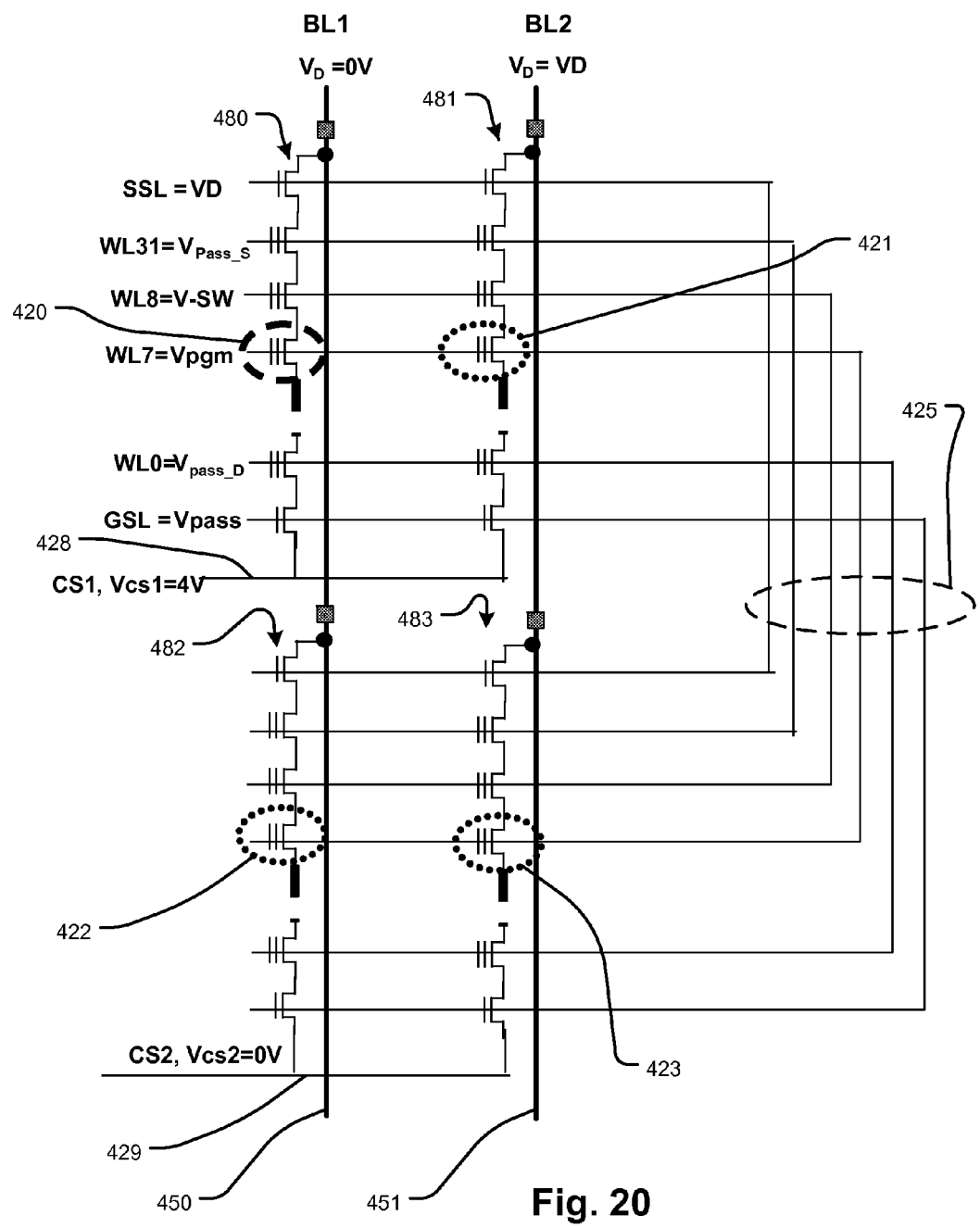
FIG. 20 is a simplified schematic diagram of a multi-plane common source type NAND-type memory array employing a program bias operation as described herein with shared word lines and common source decoding.
Figure 21:
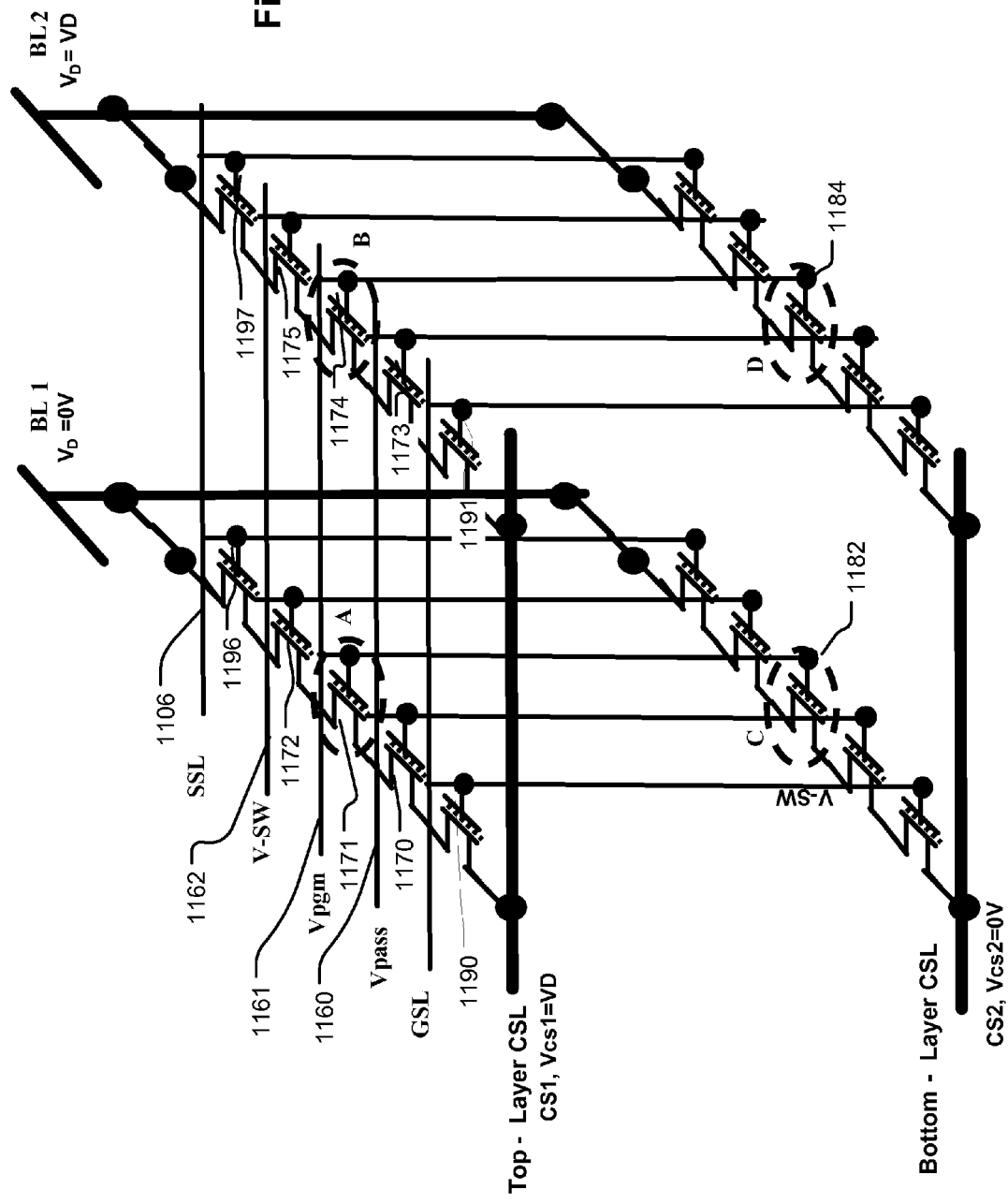
FIG. 21 is a simplified schematic diagram of a 3D common source type NAND-type memory array employing a program bias operation as described herein with shared word lines and common source decoding.

FIGS. 19, 20 and 21 illustrate the feasibility of using shared bit line or shared word line decoding techniques for a very high density array in which the memory cells are tightly packed, such as encountered in some three-dimensional and advanced two-dimensional array structures. Using shared bit lines or shared word lines allows the implementation of larger drivers and buffers than could otherwise be implemented within the pitches required for tightly packed arrays. In these configurations, there are a plurality of bit lines and a plurality of common source lines, where a first NAND string is coupled to a first bit line in the plurality of bit lines, and a first common source line in the plurality of common source lines, and a second NAND string is coupled to the first bit line, and to a second common source line in the plurality of common source lines. The first and second NAND strings can be arranged adjacent to one another in a row direction as shown in FIG. 19. The first and second NAND strings can be arranged adjacent to one another in a column direction as shown in FIG. 20, or stacked vertically as in a 3D type structure as shown in FIG. 21.

In FIG. 19, a shared bit line structure is illustrated. NAND strings 380, 381, 382, 383 are illustrated in which the NAND strings 380, 381 are coupled to bit line BL1 by shared contact 398. Likewise, NAND strings 382, 383 are coupled to bit line BL2 by shared contact 399. Two common source lines 395, 396 for CS1 and CS2, respectively, are arranged for use with these four strings. NAND strings 380 and 382 are coupled to the common source line 395 for CS1. NAND strings 381 and 383 are coupled to the common source line 396 for CS2. The programming bias arrangement for target cell 400 is illustrated in the drawing. In this example, the target memory cell is coupled to word line WL7. The switching voltage V-SW is applied to word line WL8. Pass voltages are applied to the unselected word lines and to the ground select line GSL. The string select line SSL is coupled to the supply potential VD. The first common source CS1 is coupled to positive 4 V, and the second common source CS2 is coupled to 0 V. This arrangement causes programming of the target cell 400 with the effective source portion of the semiconductor body between the SSL switch and the target cell, and the effective drain portion of the semiconductor body between the GSL switch and the target cell. The memory cells 401, 402, 403 which share word line WL7, are not disturbed because inhibit conditions are induced. For memory cell 401, the cells on the GSL side of the target cell are coupled to the second common source CS2 which is set at 0 V. Thus, the effective source and effective drain sides of the memory cell 401 are coupled both to 0 V and hot carrier injection is inhibited. For memory cells 402 and 403, the SSL line voltage is set at supply potential VD and is insufficient to turn on the SSL switches, blocking current flow in the strings and inhibiting hot carrier injection. Using the shared bit line arrangement of FIG. 19, the bit line buffer pitch can be relaxed and larger buffers can be utilized.

FIG. 20 illustrates a shared word line arrangement, allowing the use of word line drivers with relaxed pitch for example. NAND strings 480, 481, 482, 483 are illustrated. NAND strings 480 and 482 are coupled to bit line BL1 which extends along a column of NAND strings in the array as indicated by the line 450. NAND strings 481 and 483 are coupled to the bit line BL2 which extends along a column of NAND strings in the array as indicated by line 451. The word lines which traverse NAND strings 480 and 481 are connected as well to the NAND strings 482, 483 as illustrated by the coupling in region 425 of FIG. 21. Two common source lines 428, 429 for CS1 and CS2, respectively, are arranged for use with these four strings. NAND strings 480 and 481 are coupled to the common source line 428 for CS1. NAND strings 482 and 483 are coupled to the common source line 429 for CS2. Alternatively, the NAND strings 482, 483 along with CS2 can be stacked vertically above NAND strings 480, 481 and CS1. In this example, the target memory cell 420 is coupled to word line WL7, which is coupled to the memory cells 421, 422 and 423 in unselected strings. The switching voltage V-SW is applied to word line WL8. Pass voltages are applied to the unselected word lines and to the ground select line GSL. The string select line SSL is coupled to the supply potential VD. The first common source CS1 is coupled to a positive 4 V, and the second common source CS2 is coupled to 0 V. This arrangement causes programming of the target memory cell 420 with the effective source portion of the semiconductor body between the SSL switch and the target cell, and the effective drain portion of the semiconductor body between the GSL switch and the target cell. The memory cells 421, 422, 423 which share word line WL7, are not disturbed because inhibit conditions are induced. For memory cells 421 and 423 which are coupled to BL-2, the cells on the GSL side of the target cell are coupled to the first common source CS1 which is set at 4 V. The SSL line voltage is set at supply potential VD insufficient to turn on the SSL switches, blocking current flow in the strings and inhibiting hot carrier injection even though the common source lines for the two strings are set at 4 V and 0 V respectively. For memory cell to 402-422, the common source line CS2 is set at 0 V. Thus, the effective source and effective drain sides of the memory cell 422 are both coupled to 0 V and hot carrier injection is inhibited.

FIG. 21 is a schematic diagram of a 3D NAND flash array in which NAND strings in one layer share bit lines with overlying NAND strings in another layer, and NAND strings in each layer share common source lines with other NAND strings in the same layer. Using this configuration, the biasing arrangement of FIG. 20 can be applied to achieve hot carrier programming in a 3D NAND flash memory. FIG. 21 shows 2 planes of memory cells having 6 charge trapping cells arranged in a NAND configuration, which is representative of a cube which can include many planes and many word lines. The 2 planes of memory cells are defined at the cross-points of conductive lines 1160, 1161, 1162 acting as a word line WLn−1, word line WLn, and word line WLn+1, with a first stack of conductive strips, a second stack of conductive strips and a third stack of conductive strips.

The first plane of memory cells includes memory cells 1170, 1171, 1172 in a NAND string on a conductive strip, and memory cells 1173, 1174, 1175 in a NAND string on a conductive strip. The second plane of memory cells corresponds with a bottom plane in the cube in this example, and includes memory cells (e.g. 1182, 1184) arranged in NAND strings in a similar manner those in the first plane.

As shown in the figure, the conductive line 1161 acting as word line WLn includes vertical extensions between the stacks, in order to couple the conductive line 1160 to the memory cells 1170, 1173 in the first plane to memory cells in a stack in all of the planes.

String select transistors 1196, 1197 are connected between respective NAND strings and corresponding bit lines BL1 and BL2 in this arrangement. Likewise, similar string select transistors on a bottom plane in the cube are connected between respective NAND strings and a bit line BL1 and BL2 in this arrangement, so that column decoding is applied to the bit lines. String select line 1106 is connected to the string select transistors 1196, 1197, and arranged parallel to the word lines, as illustrated in FIG. 21.

Common source select transistors 1190, 1191 are arranged at the opposite ends of the NAND strings and are used to couple the NAND strings in a selected layer to a common source reference line. The common source reference lines are decoded by the plane decoder in this structure. The ground select signal GSL can be implemented in the same manner as the conductive lines 1160, 1161 and 1162. The string select transistors and common source select transistors can use the same dielectric stack as a gate oxide as the memory cells in some embodiments. In other embodiments, a typical gate oxide is used instead. Also, the channel lengths and widths can be adjusted as suits the designer to provide the switching function for the transistors. The description of a programming operation provided with reference to FIG. 20 can be applied for this configuration, where the target cell is cell A (1171 in FIG. 21) and the voltage V-SW is applied between the target cell and the switch transistor 1196 on the SSL line, and the program disturb conditions are considered for cell B (1174 in FIG. 21), representing cells on the same plane and the same row as the target cell (no programming because switch cell 1197 does not turn on), for cell C (1182 in FIG. 21), representing cells on the same row and a same column as the target cell (no programming because bit line and common source line voltages are both ground), and for cell D (1184 in FIG. 21), representing cells on the same row as the target cell but on a different column and a different plane than the target cell (no programming because the switch cell on the SSL line does not turn on).

According to this arrangement, the string select and common source select lines are decoded on a cube by cube basis. The word lines are decoded on a row by row basis. The common source lines are decoded on a plane by plane basis. The bit lines are decoded on a column by column basis.

Figure 22:
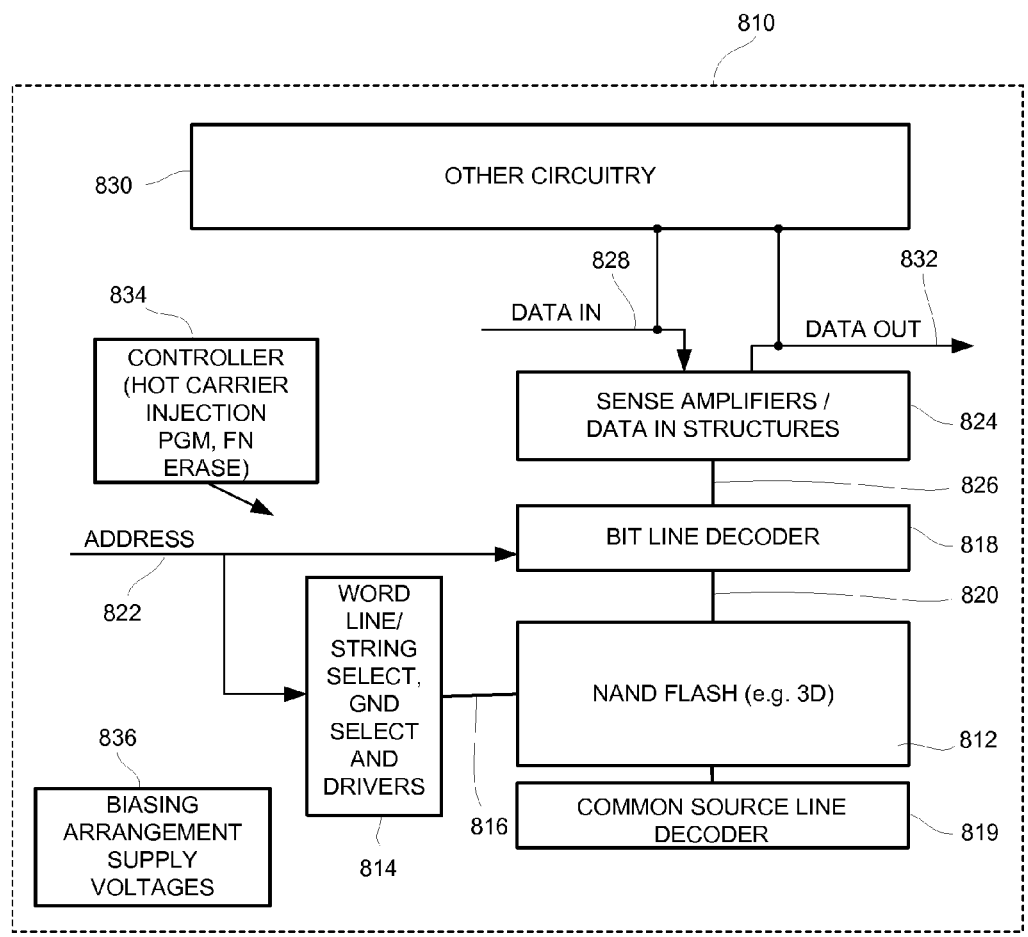
FIG. 22 is a block diagram of an integrated circuit memory employing memory cells and bias circuitry according to embodiments of the present invention.

FIG. 22 is a simplified block diagram of an integrated circuit employing hot carrier injection programmed NAND flash as described herein. The integrated circuit 810 includes a memory array 812 implemented using charge trapping memory cells or floating gate memory cells, for example, on a semiconductor substrate. A word line (or row), ground select and string select decoder 814 (including appropriate drivers) are coupled to, and in electrical communication with, a plurality 816 of word lines, string select lines and ground select lines, arranged along rows in the memory array 812. A bit line (column) decoder and drivers 818 are coupled to and in electrical communication with a plurality of bit lines 820 arranged along columns in the memory array 812 for reading data from, and writing data to, the memory cells in the memory array 812. Optionally, a common source line decoder 819 is provided to support shared word line and shared bit line arrangements like those of FIGS. 20 and 21. Addresses are supplied on bus 822 to the word line decoder and string select decoder 814 and to the bit line decoder 818. Sense amplifiers and data-in structures in block 824, including current sources for the read, program and erase modes, are coupled to the bit line decoder 818 via data bus 826. Data is supplied via the data-in line 828 from input/output ports on the integrated circuit 810 or from other data sources internal or external to the integrated circuit 810, to the data-in structures in block 824. In the illustrated embodiment, other circuitry 830 is included on the integrated circuit 810, such as a general purpose processor or special purpose application circuitry, or a combination of modules providing system-on-a-chip functionality supported by the memory cell array. Data is supplied via the data-out line 832 from the sense amplifiers in block 824 to input/output ports on the integrated circuit 810, or to other data destinations internal or external to the integrated circuit 810.

A controller 834 implemented in this example, using a bias arrangement state machine, controls the application of bias arrangement supply voltages and current sources 836, such as read, program, erase, erase verify, program verify voltages or currents for the word lines and bit lines, and controls the word line/source line operation using an access control process. The controller implements the switching sequences used to induce hot carrier programming as described herein. The controller 834 can be implemented using special purpose logic circuitry as known in the art. In alternative embodiments, the controller 834 comprises a general purpose processor, which may be implemented on the same integrated circuit, which executes a computer program to control the operations of the device. In yet other embodiments, a combination of special-purpose logic circuitry and a general-purpose processor may be utilized for implementation of the controller 834. The controller 834 can be configured to implement a method for inducing hot carrier injection in a selected cell in a NAND string in a NAND array, comprising:

controlling conductance in the NAND string by applying a switching voltage to a word line adjacent the selected word line to induce an effective source on a first side of a selected cell and to induce an effective drain on a second side of the selected cell in the NAND string;

biasing the effective drain to a drain side voltage;

biasing the effective source to a source side reference voltage;

applying a program potential greater than a hot carrier injection barrier level to the selected cell.

Where the NAND strings in the NAND array include a first switch between a first end of the NAND string and a bit line or reference line and a second switch between a second end of the NAND string and a bit line or reference line, and wherein said biasing can include turning on the first switch in the NAND string including the selected cell and applying the drain side voltage to the first semiconductor body region via the first switch, and turning on the second switch in the NAND string including the selected cell and applying the source side voltage to the second semiconductor body region via the second switch.

Alternatively, where the NAND strings in the NAND array include a first switch between a first end of the NAND string and a bit line or reference line and a second switch between a second end of the NAND string and a bit line or reference line, and wherein said biasing can include turning on the first switch in the NAND string including the selected cell and applying the source side voltage to the first semiconductor body region via the first switch, and turning on the second switch in the NAND string including the selected cell and applying the drain side voltage to the second semiconductor body region via the second switch.

The controller 834 can be configured to implement a biasing operation to prevent program disturb by turning off one of the first and second switches in at least one unselected NAND string. Also, the controller 834 can be configured to implement a biasing operation to prevent program disturb by turning on the first and second switches in at least one unselected NAND string.

The programming method described here can be applied to conventional NAND arrays using common source architectures, and modified NAND arrays with a virtual ground type architecture. For each array type, programming can be accomplished with current flow in first and second directions. According to the first current flow direction, the effective drain is located on the upper part of the NAND string, and the effective source is located on the lower part. For the second current flow direction, the effective source is located on the upper part of the NAND string while the effective drain is located on the lower part. Also, the programming method employs three representative biasing methods for inhibiting program disturb. For the first direction bias method, unselected strings can be grounded on both the effective source and effective drain sides to inhibit hot carrier injection. For the second direction programming, programming inhibit conditions can be induced by coupling the effective drain side to a drain potential, and decoupling the string from current flow allowing capacitive boosting of the effective source side to a voltage near the drain potential, also inhibiting program disturb. Also, for programming using any of the second direction current flow, the effective source and effective drain can be coupled to the same or similar potential to inhibit program disturb.

A new programming method for NAND flash is provided which suppresses program disturb due to lower operation voltage. A new program based on use of switching potentials to achieve hot carrier injection enables use of reduced operation voltage. As a result of reduced operation voltages, the driving circuitry on the integrated circuit can be implemented using only one MOSFET process, without requiring additional high voltage MOSFET processes.

Also, the WL voltage of this program method is lower than that required for conventional NAND flash FN programming operation. Thus, very high voltage driving devices are not needed. Also, the vertical electric field across the tunnel oxide in the NAND flash array is smaller than that required for FN injection. As a result of lower E-field requirements, device reliability is better.

Furthermore, lower program and VPASS voltages than required for conventional FN operation cause reduced inter-WL dielectric voltages, and thus mitigate inter-WL dielectric breakdown issues that arise as the spacing between word lines shrinks.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory comprising:
   a plurality of memory cells arranged in series in a semiconductor body;
   a plurality of word lines, word lines in the plurality coupled to corresponding memory cells in the plurality of memory cells; and
   control circuitry coupled to the plurality of word lines adapted for programming a selected memory cell in the plurality of memory cells corresponding to a selected word line by:
      biasing one of first and second ends of the plurality of memory cells to a drain side voltage, and another of the first and second ends to a source side voltage during a program interval,
      applying drain-side pass voltages to word lines between the selected word line and said one of first and second ends during a program interval,
      applying source-side pass voltages to word lines between the selected word line and said other of first and second ends during the program interval, and
      iteratively applying a program voltage to the selected word line during the program interval, and
      a switching voltage pulse to a word line and corresponding memory cell adjacent the selected word line and selected memory cell to control conductance during the program interval, followed by a verify and retry if the verify fails, wherein in each iteration the switching voltage pulse increases or decreases in magnitude, and in at least one iteration during the program interval the switching voltage pulse is a negative voltage.

2. The memory of claim 1, wherein the switching voltage varies during the program interval, so that during a portion of the program interval hot carrier injection occurs in the selected memory cell to set the selected memory cell to a program threshold level.

3. The memory of claim 1, wherein the plurality of memory cells is arranged as a NAND string.

4. The memory of claim 1, including a first switch between a reference line and the first end of the plurality of memory cells and a second switch between a first bit line and the second end of the plurality of memory cells, and wherein the control circuitry turns on the first switch during the program interval, and turns on the second switch during the program interval.

5. The memory of claim 4, including a second plurality of memory cells coupled to the plurality of word lines, a corresponding first switch between said reference line and a first end of the second plurality of memory cells and a corresponding second switch between a second bit line and a second end of the second plurality of memory cells, and wherein the control circuitry applies the drain side voltage via said first bit line to the second end of the plurality of memory cells, applies the source side voltage via the reference line to the first end of the plurality of memory cells, and applies a voltage equal to or near the source side voltage via the second bit line to the second end of the second plurality of memory cells to inhibit hot carrier injection.

6. The memory of claim 4, including a second plurality of memory cells coupled to the plurality of word lines, a corresponding first switch between said reference line and a first end of the second plurality of memory cells and a corresponding second switch between a second bit line and a second end of the second plurality of memory cells, and wherein the control circuitry applies the source side voltage via said first bit line to the second end of the plurality of memory cells, applies the drain side voltage via the reference line to the first end of the plurality of memory cells, and applies a voltage equal to or near the drain side voltage via the second bit line to the second end of the second plurality of memory cells to inhibit hot carrier injection.

7. The memory of claim 4, including a second plurality of memory cells coupled to the plurality of word lines and a second bit line, and wherein the control circuitry applies a voltage to the second bit line to inhibit hot carrier injection.

8. The memory of claim 1, wherein the plurality of memory cells is arranged as a NAND string in a common source NAND flash memory array.

9. The memory of claim 1, wherein the plurality of memory cells is arranged as a NAND string in a virtual ground NAND flash memory array.

10. The memory of claim 1, wherein data values are represented in the plurality of memory cells by a plurality of threshold states that correspond to respective ranges of threshold voltages, including a highest threshold range, and in at least one iteration during the program interval, the switching voltage pulse includes a pulse height below the highest threshold range, and in at least one iteration during the program interval the switching voltage pulse is a negative voltage.

11. A memory comprising:
   a plurality of memory cells arranged in series in a semiconductor body;
   a plurality of word lines, word lines in the plurality coupled to corresponding memory cells in the plurality of memory cells;
   control circuitry coupled to the plurality of word lines adapted for programming a selected memory cell in the plurality of memory cells corresponding to a selected word line by:
      biasing one of first and second ends of the plurality of memory cells to a drain side voltage, and another of the first and second ends to a source side voltage during a program interval,
      applying drain-side pass voltages to word lines between the selected word line and said one of first and second ends during the program interval, applying source-side pass voltages to word lines between the selected word line and said other of first and second ends during a program interval, and iteratively applying a program voltage to the selected word line during the program interval, and a switching voltage pulse to a word line and corresponding memory cell adjacent the selected word line and selected memory cell to control conductance during the program interval, followed by a verify and retry if the verify fails, wherein in each iteration the switching voltage pulse increases or decreases in magnitude, and in at least one iteration during the program interval the switching voltage pulse is a negative voltage;

a first switch between a reference line and the first end of the plurality of memory cells and a second switch between a first bit line and the second end of the plurality of memory cells; and an additional dummy cell not used for data storage, in series with the plurality of memory cells in the semiconductor body and an additional dummy word line, and disposed between the plurality of memory cells and one of the first switch and the second switch, and wherein the control circuitry applies the switching voltage to the additional dummy word line during the program interval for a target cell adjacent the additional dummy word line.

12. The memory of claim 1, including a first switch between a reference line and a first end of the plurality of memory cells and a second switch between a bit line and a second end of the plurality of memory cells.

13. The memory of claim 12, including a second plurality of memory cells coupled to the plurality of word lines and to a second bit line, and wherein the control circuitry operates during the program interval to bias the second bit line so that a first semiconductor body region for the second plurality of cells on a first side of the selected word line and a second semiconductor body region for the second plurality of cells on a second side of the selected word line are biased near to a given voltage level, such as the source side voltage or the drain side voltage, to inhibit hot carrier generation.

14. The memory of claim 11, wherein said applying a switching voltage comprises an iteration including a sequence of pulses of increasing or decreasing magnitude.

15. The memory of claim 11, wherein said applying a switching voltage comprises applying one or more pulses having at least one of a ramped rising and ramped falling edge.

16. The memory of claim 11, wherein data values are represented in the plurality of memory cells by a plurality of threshold states that correspond to respective ranges of threshold voltages, including a highest threshold range, and in at least one iteration during the program interval, the switching voltage pulse includes a pulse height below the highest threshold range, and in at least one iteration during the program interval the switching voltage pulse is a negative voltage.

17. A memory comprising:
a plurality of bit lines and a plurality of common source lines;
a plurality of memory cells;
a plurality of word lines, word lines in the plurality coupled to corresponding memory cells in the plurality of memory cells, wherein the plurality of memory cells is arranged as a first NAND string coupled to a first bit line in the plurality of bit lines and a first common source line in the plurality of common source lines;
a plurality of additional NAND strings coupled to the plurality of word lines, the plurality of bit lines, and the plurality of common source lines, wherein a second NAND string in the plurality of additional NAND strings is coupled to word lines in the plurality of word lines shared with the first NAND string, to the first bit line and to a second common source line in the plurality of common source lines; and control circuitry coupled to the plurality of word lines adapted for programming a selected memory cell in the first NAND string corresponding to a selected word line by:
biasing one of first and second ends of the first NAND string to a drain side voltage via the first common source line, and another of the first and second ends to a source side voltage via the first bit line during a program interval, applying drain-side pass voltages to word lines between the selected word line and said one of first and second ends during the program interval, applying source-side pass voltages to word lines between the selected word line and said other of first and second ends during a program interval, and iteratively applying a program voltage to the selected word line during the program interval, and a switching voltage pulse to a word line and corresponding memory cell adjacent the selected word line and selected memory cell to control conductance during the program interval, followed by a verify and retry if the verify fails, wherein in each iteration the switching voltage pulse increases or decreases in magnitude, and in at least one iteration during the program interval the switching voltage pulse is a negative voltage.

18. The memory of claim 17, wherein the first and second NAND strings are arranged adjacent to one another in a row direction.

19. The memory of claim 17, wherein the first and second NAND strings are arranged adjacent to one another in a column direction.

20. The memory of claim 17, wherein the plurality of memory cells is arranged in a plurality of layers and the first NAND string is disposed in one layer of the plurality of layers and the second NAND string is disposed in another layer in the plurality of layers and is coupled to the first bit line and to a second common source line in the plurality of common source lines and the plurality of memory cells includes a third NAND string in the plurality of additional NAND strings and in said one layer in the plurality of layers coupled to another bit line and to said first common source line.

21. The memory of claim 17, wherein data values are represented in the plurality of memory cells by a plurality of threshold states that correspond to respective ranges of threshold voltages, including a highest threshold range, and in at least one iteration during the program interval, the switching voltage pulse includes a pulse height below the highest threshold range, and in at least one iteration during the program interval the switching voltage pulse is a negative voltage.

22. A memory comprising:
a plurality of memory cells arranged in series in a semiconductor body;
a plurality of word lines, word lines in the plurality coupled to corresponding memory cells in the plurality of memory cells;
control circuitry coupled to the plurality of word lines adapted for programming a selected memory cell in the plurality of memory cells corresponding to a selected word line by:
biasing one of first and second ends of the plurality of memory cells to a drain side voltage, and another of the first and second ends to a source side voltage during a program interval, applying drain-side pass voltages to word lines between the selected word line and said one of first and second ends during the program interval, applying source-side pass voltages to word lines between the selected word line and said other of first and second ends during a program interval, and iteratively applying a program voltage to the selected word line during the program interval, and a switching voltage pulse to a word line and corresponding memory cell adjacent the selected word line and selected memory cell to control conductance during the program interval, followed by a verify and retry if the verify fails, wherein in each iteration the switching voltage pulse increases or decreases in magnitude within a range, and in at least one iteration during the program interval the switching voltage pulse is a negative voltage; and wherein the control circuitry applies switching voltages which change during the program interval from a level that blocks current flow to a level within the range that supports hot carrier injection to more than one word line during the program interval.

23. The memory of claim 22, wherein data values are represented in the plurality of memory cells by a plurality of threshold states that correspond to respective ranges of threshold voltages, including a highest threshold range, and in at least one iteration during the program interval, the switching voltage pulse includes a pulse height below the highest threshold range, and in at least one iteration during the program interval the switching voltage pulse is a negative voltage.

24. A memory comprising:
a NAND string including a plurality of memory cells arranged in series in a semiconductor body;
a plurality of word lines, word lines in the plurality coupled to corresponding memory cells in the plurality of memory cells; and
control circuitry coupled to the plurality of word lines adapted for programming a selected memory cell in the plurality of memory cells corresponding to a selected word line by:
controlling conductance in the NAND string by applying a switching voltage pulse to a word line adjacent the selected word line to induce an effective source in a first semiconductor body region on one side of a selected cell and to induce an effective drain in a second semiconductor body region on another side of the selected cell in the NAND string;
biasing the first semiconductor body region to a source side voltage;
biasing the second semiconductor body region to a drain side voltage; and
iteratively applying a program potential greater than a hot carrier injection barrier level to the selected cell during a program interval, followed by a verify and retry if the verify fails, wherein in each iteration the switching voltage pulse increases or decreases in magnitude, and in at least one iteration during the program interval the switching voltage pulse is a negative voltage.

25. The memory of claim 24, wherein data values are represented in the plurality of memory cells by a plurality of threshold states that correspond to respective ranges of threshold voltages, including a highest threshold range, and in at least one iteration during the program interval, the switching voltage pulse includes a pulse height below the highest threshold range, and in at least one iteration during the program interval the switching voltage pulse is a negative voltage.

26. A method for inducing hot carrier injection in a selected cell in a NAND string in a NAND array, comprising:
controlling conductance in the NAND string by applying a switching voltage pulse to a word line adjacent the selected word line to induce an effective source on a first side of a selected cell and to induce an effective drain on a second side of the selected cell in the NAND string;
biasing the effective drain to a drain side voltage;
biasing the effective source to a source side reference voltage;
iteratively applying a program potential greater than a hot carrier injection barrier level to the selected cell during a program interval, followed by a verify and retry if the verify fails, wherein in each iteration the switching voltage pulse increases or decreases in magnitude, and in at least one iteration during the program interval the switching voltage pulse is a negative voltage.

27. The method of claim 26, wherein NAND strings in the NAND array include a first switch between a first end of the NAND string and a bit line or reference line and a second switch between a second end of the NAND string and a bit line or reference line, and wherein said biasing includes:
turning on the first switch in the NAND string including the selected cell and applying the source side voltage to the first end of the NAND string via the first switch; and
turning on the second switch in the NAND string including the selected cell and applying the drain side voltage to the second end of the NAND string via the second switch.

28. The method of claim 26, wherein NAND strings in the NAND array include a first switch between a first end of the NAND string and a bit line or reference line and a second switch between a second end of the NAND string and a bit line or reference line, and wherein said biasing includes:
turning on the first switch in the NAND string including the selected cell and applying the drain side voltage to the first end of the NAND string via the first switch; and
turning on the second switch in the NAND string including the selected cell and applying the source side voltage to the second end of the NAND string via the second switch.

29. The method of claim 28, said biasing including turning off one of the first and second switches in at least one unselected NAND string.

30. The method of claim 28, said biasing including turning on the first and second switches in at least one unselected NAND string.

31. The method of claim 26, wherein data values are represented in the plurality of memory cells by a plurality of threshold states that correspond to respective ranges of threshold voltages, including a highest threshold range, and in at least one iteration during the program interval, the switching voltage pulse includes a pulse height below the highest threshold range, and in at least one iteration during the program interval the switching voltage pulse is a negative voltage.

* * * * *